United States Patent
Bradley et al.

(10) Patent No.: US 12,362,722 B2
(45) Date of Patent: Jul. 15, 2025

(54) RESONATOR WITH INTRINSIC SECOND HARMONIC CANCELLATION

(71) Applicant: Avago Technologies International Sales Pte. Limited, Singapore (SG)

(72) Inventors: Paul Bradley, Los Altos, CA (US); Richard Ruby, Menlo Park, CA (US); Reed Parker, Saratoga, CA (US); Donald E. Lee, Fort Collins, CO (US)

(73) Assignee: Avago Technologies International Sales Pte. Limited, Palo Alto, CA (US)

( * ) Notice: Subject to any disclaimer, the term of this patent is extended or adjusted under 35 U.S.C. 154(b) by 414 days.

(21) Appl. No.: 17/868,978

(22) Filed: Jul. 20, 2022

(65) Prior Publication Data
US 2024/0030889 A1    Jan. 25, 2024

(51) Int. Cl.
*H03H 9/13*    (2006.01)
*H03H 9/02*    (2006.01)
*H03H 9/205*    (2006.01)
*H03H 9/54*    (2006.01)

(52) U.S. Cl.
CPC .......... *H03H 9/13* (2013.01); *H03H 9/02031* (2013.01); *H03H 9/205* (2013.01); *H03H 9/54* (2013.01)

(58) Field of Classification Search
CPC ...... H03H 9/13; H03H 9/02031; H03H 9/205; H03H 9/54; H03H 3/02; H03H 9/585; H03H 9/02015; H03H 9/15; H03H 9/131
USPC ......................................... 333/133, 186–188
See application file for complete search history.

(56) References Cited

U.S. PATENT DOCUMENTS

| | | | |
|---|---|---|---|
| 5,910,756 A | 6/1999 | Ella | |
| 6,081,171 A | 6/2000 | Ella | |
| 7,365,619 B2 | 4/2008 | Aigner et al. | |
| 7,367,095 B2 * | 5/2008 | Larson, III | H03H 9/605 29/25.35 |
| 7,515,018 B2 | 4/2009 | Handtmann et al. | |
| 7,889,024 B2 | 2/2011 | Bradley et al. | |
| 9,847,768 B2 | 12/2017 | Grannen et al. | |
| 11,101,783 B2 | 8/2021 | Burak et al. | |
| 11,101,787 B2 | 8/2021 | Ando et al. | |
| 2009/0079514 A1 | 3/2009 | Jamneala et al. | |
| 2012/0293278 A1 | 11/2012 | Burak et al. | |
| 2014/0132117 A1 * | 5/2014 | Larson, III | C23C 14/0617 204/192.1 |
| 2016/0079958 A1 | 3/2016 | Burak | |
| 2016/0118956 A1 | 4/2016 | Kihara et al. | |
| 2016/0191015 A1 | 6/2016 | Ivira et al. | |
| 2018/0123555 A1 | 5/2018 | Lee | |
| 2018/0278234 A1 * | 9/2018 | Hurwitz | H03H 9/1014 |

(Continued)

FOREIGN PATENT DOCUMENTS

JP    2019193220 A    10/2019

*Primary Examiner* — Jorge L Salazar, Jr.
(74) *Attorney, Agent, or Firm* — Quarles & Brady LLP

(57) ABSTRACT

A resonator may include a first electrode, a second electrode, and a piezoelectric material between the first electrode and the second electrode, where the piezoelectric material is formed by fabricating the piezoelectric material with a compression axis vector (C-axis vector) oriented along a first direction and applying an electric field across the piezoelectric material to modify a direction of the C-axis vector to be oriented along a second direction. The second direction may be antiparallel to the first direction.

20 Claims, 17 Drawing Sheets

(56) References Cited

U.S. PATENT DOCUMENTS

2021/0257987 A1 8/2021 Tabrizian
2021/0384887 A1 12/2021 Mortazawi et al.

* cited by examiner

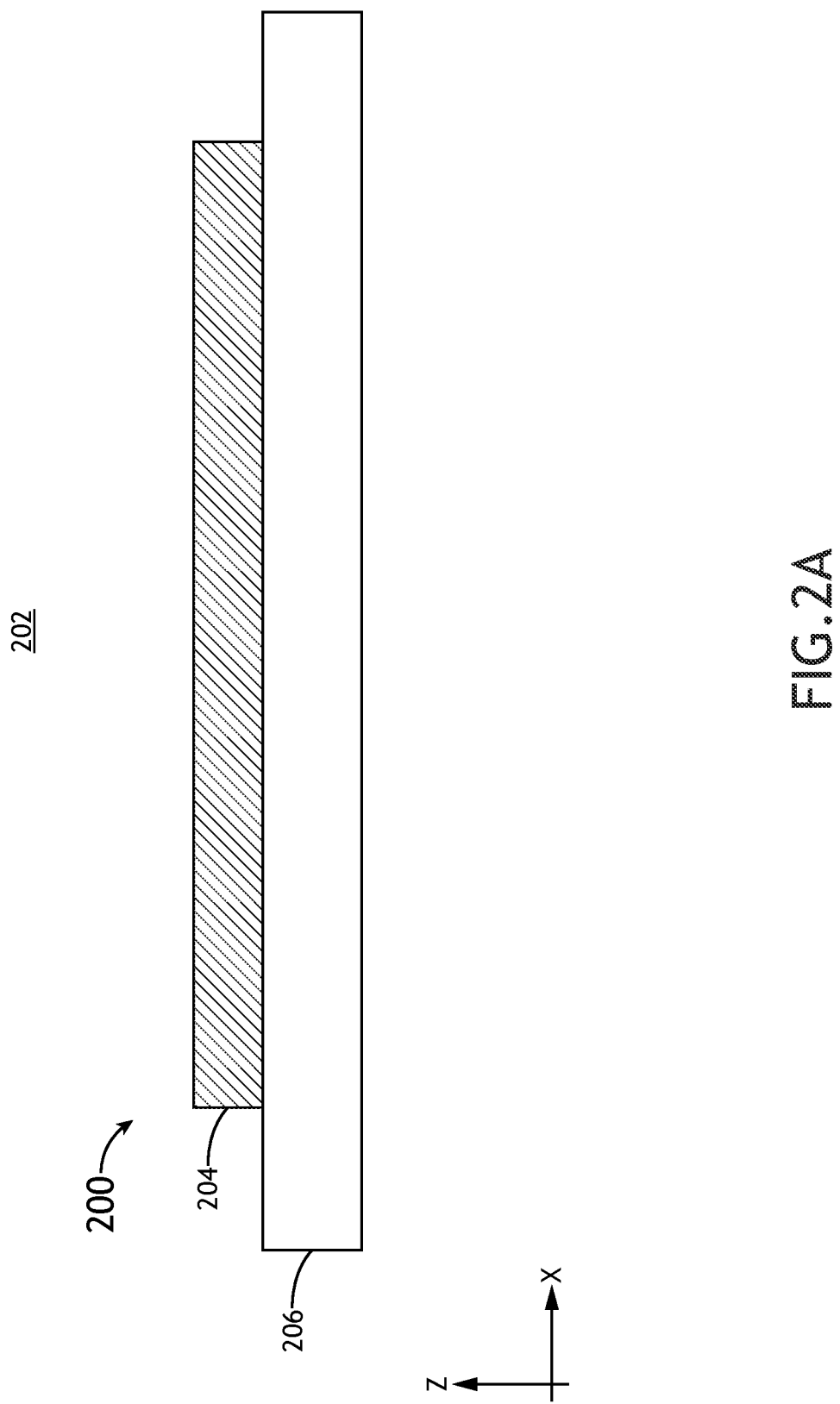

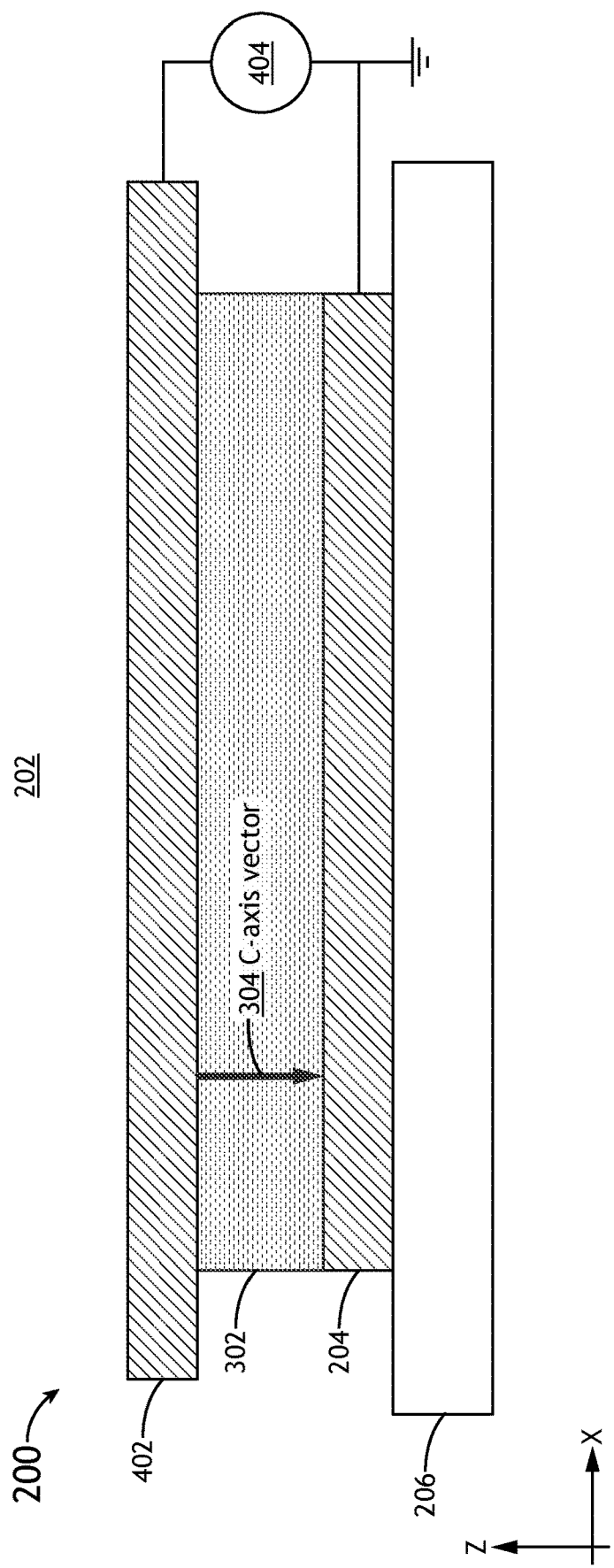

RESONATOR WITH INTRINSIC SECOND HARMONIC CANCELLATION

TECHNICAL FIELD

The present disclosure relates generally to resonators and, more particularly, to resonators having modified compression axis vectors.

BACKGROUND

Resonators (e.g., acoustic resonators) are used in many applications including, but not limited to, radio-frequency (RF) communication applications. For example, resonators are commonly used within RF passband filters on transmission and/or reception pathways. One class of resonators includes bulk acoustic-wave resonators formed from piezoelectric materials, which provide acoustic oscillations in response to time-varying electronic signals. For example, a piezoelectric material may expand or contract along a compression axis (C-axis) in response to an applied voltage, where the C-axis is typically based on an orientation of a crystalline structure of the piezoelectric material. Further, such resonators may exhibit acoustic resonant modes (e.g., resonant frequencies, resonances, or the like) that may be exploited to provide desired properties when implemented within an electronic circuit such as, but not limited to, a filter.

It is becoming increasingly desirable to provide greater control over a direction of a C-axis (e.g., a C-axis vector) for one or more piezoelectric materials within a resonator. For example, controlling C-axis directions of piezoelectric materials may allow greater flexibility in the design of resonators or electrical circuits such as, but not limited to, filters that include resonators.

SUMMARY

A resonator is disclosed in accordance with one or more illustrative embodiments of the present disclosure. In one illustrative embodiment, a resonator includes a first electrode. In another illustrative embodiment, a resonator includes a second electrode. In another illustrative embodiment, a resonator includes a piezoelectric material between the first electrode and the second electrode. In another illustrative embodiment, the piezoelectric material is formed by fabricating the piezoelectric material with a C-axis vector oriented along a first direction and applying an electric field across the piezoelectric material to modify a direction of the C-axis vector to be oriented along a second direction different than the first direction.

A circuit is disclosed in accordance with one or more illustrative embodiments of the present disclosure. In one illustrative embodiment, the circuit includes one or more resonators. In another illustrative embodiment, at least one of the one or more resonators includes a first electrode, a second electrode, and a piezoelectric material between the first electrode and the second electrode. In another illustrative embodiment, the piezoelectric material is formed by fabricating the piezoelectric material with a C-axis vector oriented along a first direction and applying an electric field across the piezoelectric material to modify a direction of the C-axis vector to be oriented along a second direction different than the first direction.

A method is disclosed in accordance with one or more illustrative embodiments of the present disclosure. In one illustrative embodiment, the method includes fabricating a first electrode. In another illustrative embodiment, the method includes fabricating a piezoelectric material with a compression axis (C-axis) vector oriented along a first direction. In another illustrative embodiment, the method includes applying an electric field across the piezoelectric material to modify a direction of the C-axis vector from the first direction to a second direction, where the second direction is different than the first direction. In another illustrative embodiment, the method includes fabricating a second electrode, wherein the piezoelectric material is disposed between the first electrode and the second electrode.

It is to be understood that both the foregoing general description and the following detailed description are exemplary and explanatory only and are not necessarily restrictive of the invention as claimed. The accompanying drawings, which are incorporated in, and constitute a part of the specification, illustrate embodiments of the invention and, together with the general description, explain the principles of the invention.

BRIEF DESCRIPTION OF DRAWINGS

The numerous advantages of the disclosure may be better understood by those skilled in the art by reference to the accompanying figures.

FIG. 2A is a simplified side view of a portion of a resonator including the first electrode, in accordance with one or more embodiments of the present disclosure.

FIG. 4A is a simplified side view of a portion of a resonator along with a second electrode formed as a conductive plate placed in contact with the piezoelectric material, in accordance with one or more embodiments of the present disclosure.

DETAILED DESCRIPTION

Figure 1A:
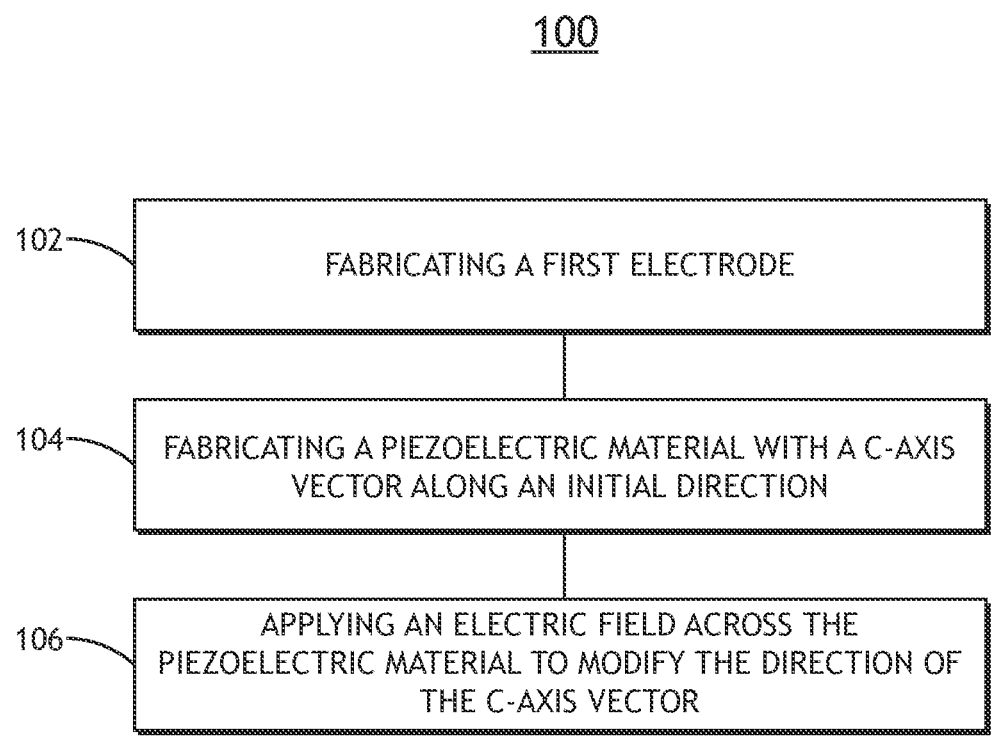
FIG. 1A is a flow diagram illustrating steps performed in a method for fabricating a resonator, in accordance with one or more embodiments of the present disclosure.

Reference will now be made in detail to the subject matter disclosed, which is illustrated in the accompanying drawings. The present disclosure has been shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

As used herein, directional terms such as "top," "bottom," "over," "under," "upper," "upward," "lower," "down," and "downward" are intended to provide relative positions for purposes of description and are not intended to designate an absolute frame of reference. Various modifications to the described embodiments will be apparent to those with skill in the art, and the general principles defined herein may be applied to other embodiments.

It is to be understood that depicted architectures are merely exemplary and that many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Additionally, unless otherwise indicated, a description indicating that one component is "connected to" another component (alternatively "located on," "disposed on," or the like) indicates that such components are functionally connected and does not necessarily indicate that such components are physically in contact. Rather, such components may be in physical contact or may alternatively include intervening elements. Similarly, descriptions that a particular component is "fabricated over" another component indicates a relative position of such components but does not necessarily indicate that such components are physically in contact. Such components may be in physical contact or may alternatively include intervening elements.

Embodiments of the present disclosure are directed to systems and methods for providing a resonator with at least one piezoelectric material having a compression axis (C-axis) vector that is modified after fabrication, where the C-axis vector corresponds to a direction of motion of the piezoelectric material in response to an applied electric field. A resonator may include a device that exhibits mechanical oscillations in response to applied signals or vice versa. In this way, resonators may provide mechanical responses to applied electrical signals or provide electrical signals in response to mechanical stress. Such a device may also be considered an acoustic resonator, an acoustic-wave resonator, or a bulk acoustic-wave (BAW) resonator.

The modified C-axis vector may have any orientation with respect to an initial C-axis vector. In some embodiments, a modified C-axis vector has an orientation antiparallel to the initial C-axis vector. For example, a modified C-axis vector that is antiparallel to an initial C-axis vector may have a direction that is opposite the initial C-axis vector but oriented along a common axis.

As used herein, a piezoelectric material may include any material or combination of materials that exhibits piezoelectric properties providing a modified structural state (e.g., a compressed structural state, an expanded mechanical state, mechanical stress, or the like) in response to an applied electric field, or vice versa. In particular, a mechanical deformation of a piezoelectric material in response to an applied electric field may depend on the direction and strength of the applied electric field as well as a polarization (e.g., a polarization vector) associated with a density of dipoles in the piezoelectric material, where the polarization of a material may be characterized as positive or negative and may be based on crystal orientation. It is noted that the term piezoelectric effect is used herein to broadly refer to both a mechanical deformation in response to an applied electric field and the generation of an electric field (e.g., separated charges) in a material in response to mechanical stress.

Some combinations of material polarization and electric field may result in a piezoelectric material that is compression positive (e.g., a Class I piezoelectric material), which compresses along a C-axis. As another example, some combinations of material polarization and electric field may result in a piezoelectric material that is compression negative (e.g., a Class II piezoelectric material), which expands along a C-axis.

As used herein, the term C-axis vector is used to describe both whether a piezoelectric material is compression positive or compression negative as well as an axis of compression or expansion (e.g., a C-axis). In particular, the C-axis vector is depicted as an arrow where an orientation of a C-axis vector is indicative of the C-axis, and a direction of the arrow indicates whether the piezoelectric material is compression positive or compression negative along this C-axis.

It is contemplated herein that a piezoelectric material may exhibit different responses to different strengths of an applied electric field. For example, a piezoelectric material may exhibit a temporary mechanical distortion in accordance with the piezoelectric effect in response to an electric field strength in a first range (e.g., an operational range). In some cases, the mechanical distortion is proportional to the strength of the applied electric field in this first range. This first range may thus be suitable for applications taking advantage of the piezoelectric effect. As another example, a piezoelectric material may exhibit a destructive breakdown when exposed to an electric field with a strength above a breakdown threshold. For instance, the application of an electric field across a piezoelectric material with a strength equal to or exceeding the breakdown threshold may disrupt the piezoelectric properties of the piezoelectric material beyond a tolerance such that a resonator including the piezoelectric material does not operate within specified parameters. In another instance, the application of an electric field across a piezoelectric material with a strength that equals or exceeds the breakdown voltage may result in dielectric breakdown of the piezoelectric material.

It is further contemplated herein that, for at least some compositions of piezoelectric materials, application of an electric field across a piezoelectric field with a strength in a certain range may induce a structural change that impacts the polarization and/or the C-axis vector of the material. This process may be referred to as poling. For example, application of an electric field with a strength in this range may modify a piezoelectric material from being compression positive to compression negative, or vice versa. Further, this structural change may persist after the application of the electric field such that this structural change and the associated change of the C-axis vector may be characterized as permanent or semi-permanent. However, for at least some compositions of piezoelectric materials, this structural change may be reversed by application of an electric field of a certain strength in an opposing direction (e.g., poling in the opposite direction).

A mechanical response of the piezoelectric material to an incident electric field with a strength in the first range (e.g., the operational range) may be thus modified through modification of the C-axis vector of the piezoelectric material.

A composition of a piezoelectric material suitable for C-axis vector modification may be selected to provide that an electric field suitable for modifying a direction of its C-axis vector is lower than a corresponding breakdown threshold. In this way, modification of the C-axis vector does not result in destructive damage to the piezoelectric material.

In some embodiments, a piezoelectric material may include one or more dopants (e.g., dopant materials) that may reduce a magnitude of the electric field required to modify the C-axis vector. In some embodiments, a resonator includes a piezoelectric material formed from aluminum nitride (AlN) doped with one or more dopants. For example, a resonator may include a piezoelectric material formed from AlN doped with scandium to form aluminum scandium nitride (AlScN or more simply ASN). As another example, a resonator may include a piezoelectric material formed from AlN doped with boron. As another example, a resonator may include a piezoelectric material formed from AlN doped with a combination of scandium and boron.

An electric field may be applied across a piezoelectric material to modify the C-axis vector using any technique known in the art. In some embodiments, an electric field is applied across a piezoelectric material by applying a voltage (e.g., an electric potential) across the piezoelectric material. It is to be understood, however, that descriptions or examples herein referring to the application of a voltage across a piezoelectric material are provided solely for illustrative purposes and should not be interpreted as limiting. In this way, descriptions of applying a voltage across a material or applying an electric field across a material are used interchangeably.

It is contemplated herein that the modification of a C-axis vector of a piezoelectric material using an applied electric field may enable the fabrication of a resonator or other piezoelectric device while also ensuring a high electromechanical coupling coefficient (e.g., $k_t^2$ or any other suitable metric). It may be possible in some applications to directly fabricate a piezoelectric material with a C-axis vector in an arbitrary or selected direction. For example, the fabrication of resonators with multiple piezoelectric layers with anti-parallel C-axis vectors using different seed layers is generally described in U.S. Pat. No. 9,847,768 issued on Dec. 19, 2017, which is incorporated by reference herein in its entirety. However, the electromechanical coupling coefficient may vary for different growth patterns such that directly fabricating piezoelectric layers with different C-axis vectors may not provide equivalent performance. In resonators or other devices including multiple piezoelectric layers, different electromechanical coupling coefficients for the different piezoelectric layers may reduce performance in various ways such as, but not limited to, reducing harmonic cancellation. In contrast, fabricating piezoelectric layers with C-axis vectors in a common direction and subsequently modifying the C-axis vectors of one or more of the piezoelectric layers may provide more consistent and, in some cases, better electromechanical coupling coefficients.

Some embodiments of the present disclosure are directed to methods of fabricating a resonator including fabricating one or more piezoelectric materials and subsequently modifying the C-axis vector of at least one of the piezoelectric materials from an initial state.

Some embodiments of the present disclosure are directed to resonators including at least one piezoelectric material with a C-axis vector modified from an initial state. Such a resonator may have any design including, but not limited to, film bulk acoustic resonator (FBAR), double BAR (DBAR), stacked BAR (SBAR), or reversed stacked BAR (RSBAR) designs.

Some embodiments of the present disclosure are directed to a circuit including one or more resonators having a modified C-axis vector as disclosed herein. For example, such a circuit may be a filter including any number of resonators arranged in any suitable filter design. In some embodiments, all resonators in a circuit are formed with a modified C-axis vector as disclosed herein. In some embodiments, a circuit includes resonators having different designs, where at least one of the resonators has a modified C-axis vector as disclosed herein.

Referring now to FIGS. 1A-8, systems and methods for providing resonators with at least one piezoelectric material having a modified C-axis vector (e.g., with respect to an initial direction or orientation) are described in greater detail, in accordance with one or more embodiments of the present disclosure.

FIG. 1A is a flow diagram illustrating steps performed in a method 100 for fabricating a resonator, in accordance with one or more embodiments of the present disclosure. It is to be understood that the method 100 is not limited to the particular steps depicted in FIG. 1A. In some embodiments, the method 100 may include additional steps, which may be performed before the depicted steps, after the depicted steps, and/or between any of the depicted steps. In some embodiments, not all of the steps depicted in FIG. 1A are performed.

As used herein, illustrations and/or descriptions of the fabrication of one component or material over another component or material are used to indicate relative orientations of the various components. However, such illustrations and/or descriptions are illustrative only and should not be interpreted as limiting. Unless otherwise indicated, illustrations and/or descriptions of the fabrication of one component over another may apply to embodiments in which the two components are in direct physical contact and to embodiments in which intervening components are located between the two components.

FIGS. 2A-8 depict various non-limiting illustrations of a resonator 200 on a sample 202 fabricated with the steps of the method 100. It is to be understood that the embodiments and enabling technologies described herein in the context of FIGS. 2A-8 should be interpreted to extend to the method 100. However, the method 100 is not limited to the depictions in FIGS. 2A-8.

In some embodiments, the method 100 includes a step 102 of fabricating a first electrode 204 (e.g., a conductor through which electricity enters or leaves). FIG. 2A is a simplified side view of a portion of a resonator 200 including the first electrode 204, in accordance with one or more embodiments of the present disclosure. The first electrode 204 may be formed from any suitable conductive material including, but not limited to, molybdenum (Mo) or tungsten (W).

The first electrode 204 may be fabricated on any suitable material. In some embodiments, as illustrated in FIG. 2A, the first electrode 204 is fabricated on a substrate 206. In some embodiments, though not shown, the first electrode 204 is fabricated at least partially over a cavity (e.g., a cavity in a substrate 206). In some embodiments, the first electrode 204 is fabricated as an intermediate electrode in a stacked structure. For example, the first electrode 204 may be fabricated over a material layer such as, but not limited to, a layer of piezoelectric material.

Figure 2B:
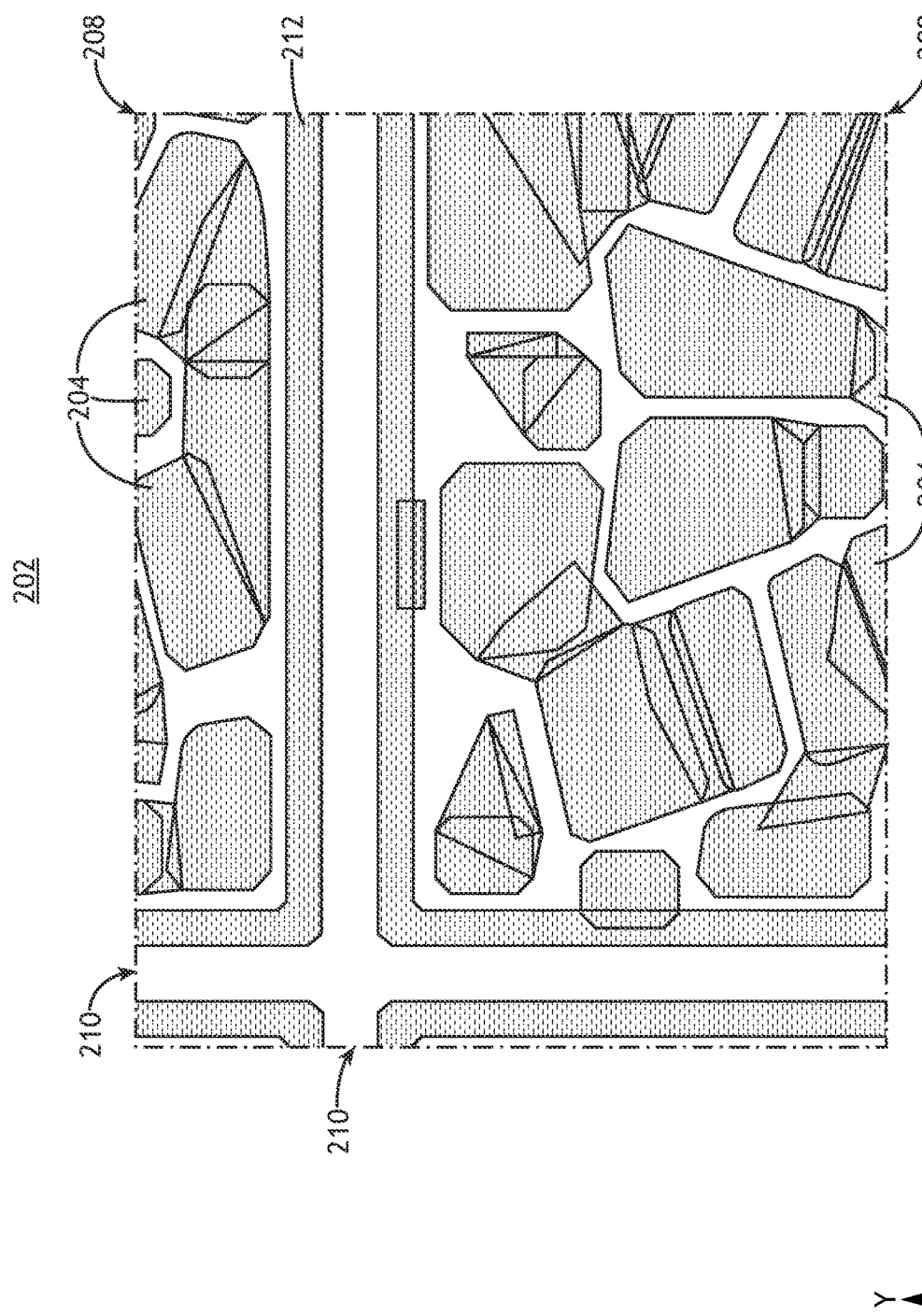
FIG. 2B is a top view of a sample including multiple first electrodes, in accordance with one or more embodiments of the present disclosure.

FIG. 2B is a top view of a sample 202 including multiple first electrodes 204 (e.g., for the formation of multiple resonators 200), in accordance with one or more embodiments of the present disclosure. In particular, FIG. 2B illustrates a portion of a sample 202 including multiple dies 208 separated by alleys 210, where each of the dies 208 include multiple first electrodes 204 surrounded by a seal ring 212. It is to be understood that the particular illustration of the dies 208 and the constituent components is provided solely for illustrative purposes and should not be interpreted as limiting. Rather, a sample 202 may include any number of first electrodes 204 with any sizes or distributions. Further, the dies 208 need not necessarily include a seal ring 212.

Figure 3:
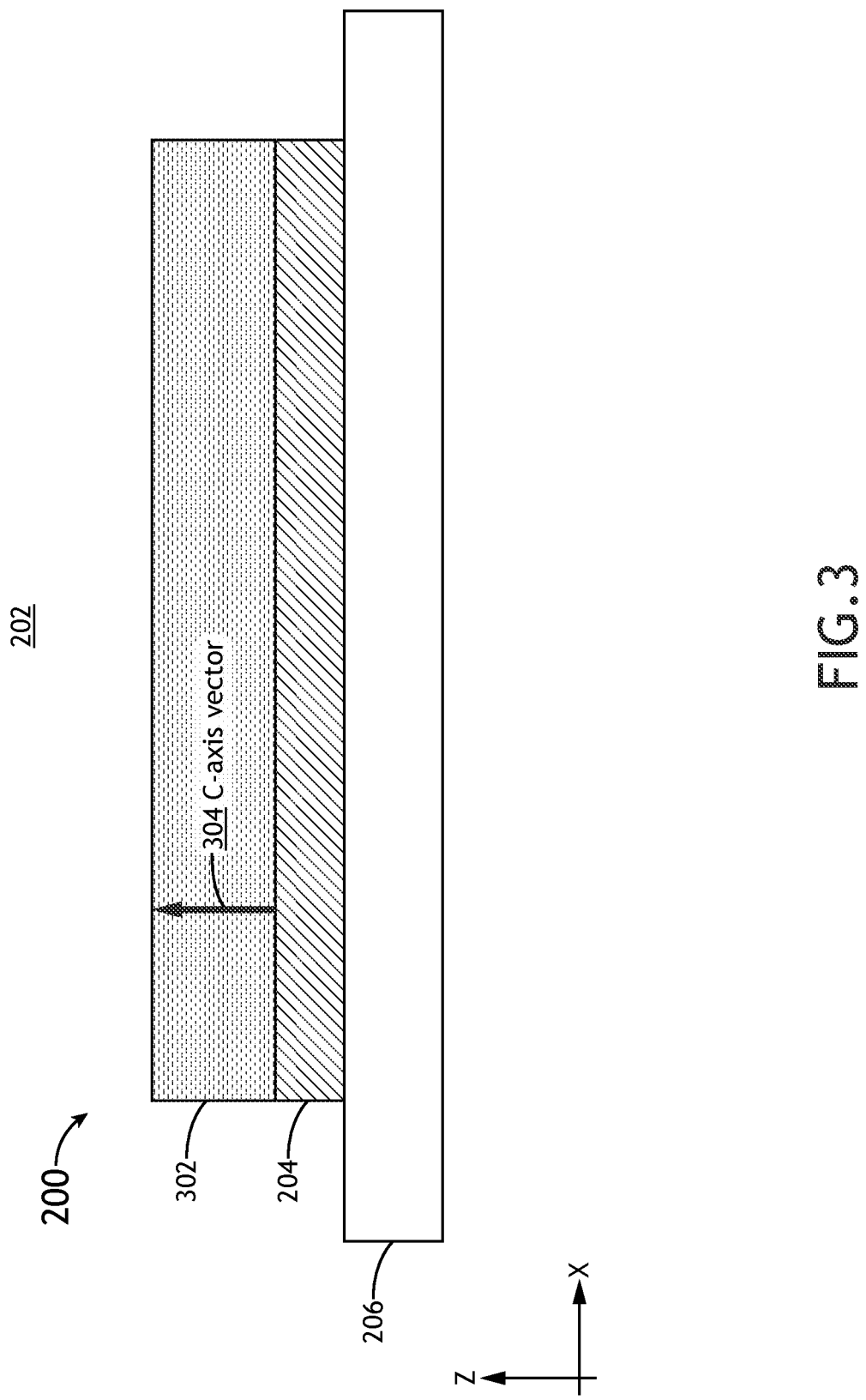
FIG. 3 is a simplified side view of a portion of a resonator including a first electrode and a piezoelectric material, in accordance with one or more embodiments of the present disclosure.

Referring now to FIG. 1A and FIG. 3, in some embodiments, the method 100 includes a step 104 of fabricating a piezoelectric material 302 with a C-axis vector 304 oriented along an initial direction. The step 104 of fabricating a piezoelectric material 302 may be performed using any technique known in the art including, but not limited to, a sputtering technique. FIG. 3 is a simplified side view of a portion of a resonator 200 including a first electrode 204 and a piezoelectric material 302, in accordance with one or more embodiments of the present disclosure.

In FIG. 3, the C-axis vector 304 is represented as an arrow pointing in a +Z direction (e.g., away from the substrate 206), such that the piezoelectric material 302 is compression positive along the Z axis. This initial direction of the C-axis vector 304 may be dictated or at least influenced by a structure of the piezoelectric material 302 (e.g., an orientation of a crystalline structure). However, it is to be understood that the C-axis vector 304 may have any initial direction and is not limited to the direction illustrated in FIG. 3.

It is contemplated herein that the piezoelectric material 302 may generally be formed from any composition suitable for providing a piezoelectric effect and for which a direction of the C-axis vector 304 may be modified after fabrication through the application of an electric field. For example, the piezoelectric material 302 may include any material with piezoelectric properties suitable for use in a resonator 200 such as, but not limited to, AlN or zinc oxide (ZnO), as well as variants thereof.

In some embodiments, the piezoelectric material 302 includes a base material and one or more dopant materials (e.g., dopants). For example, the piezoelectric material 302 may include a base material doped with one or more rare earth metals such as, but not limited to, scandium, yttrium, lanthanum, or elements with atomic numbers ranging from 58-71. As an illustration, the piezoelectric material 302 may include a base material of AlN doped with scandium to form ASN. In some embodiments, the piezoelectric material 302 is formed as AlN doped with a scandium concentration of approximately 35% or less. In some embodiments, the piezoelectric material 302 is formed as AlN doped with a scandium concentration of approximately 22% or less. As another example, the piezoelectric material 302 may include a base material doped with boron. In some embodiments, the piezoelectric material 302 is formed as AlN doped with a boron concentration of approximately 7%. As another example, the piezoelectric material 302 may include a base material doped with a combination of two or more different dopants. As an illustration, the piezoelectric material 302 may include AlN doped with a combination of scandium and boron. It is to be understood, however, that the examples herein are solely illustrative and are not limiting on the present disclosure.

It is further contemplated herein that the composition of the piezoelectric material 302 may be tailored to provide a balance of various properties such as, but not limited to, an electric field strength necessary to modify a C-axis vector 304, electromechanical coupling properties (e.g., as measured by $k_t^2$ or any other suitable metric) or thermal properties. As an illustration, a specific composition of AlN with one or more dopant materials (e.g., with a rare earth metal, boron, or any other suitable material) may be selected to lower an electric field strength necessary to modify a C-axis vector 304 (or pole the material more generally) to a value or range of values lower than a breakdown threshold of the AlN (or a base material more generally). In this way, the C-axis vector 304 may be modified without damage to the piezoelectric material 302. Further, the particular composition and/or concentration of the dopants may impact additional properties such as, but not limited to, electromechanical coupling properties. For instance, AlN doped with boron may in some cases provide a lower $k_t^2$ metric than AlN doped with scandium. In this way, the particular value of the $k_t^2$ metric may be tuned through selection of the concentrations of boron and scandium dopant materials while maintaining the ability to modify the C-axis vector 304 through application of an electric field as disclosed herein.

As illustrated in FIG. 3, the piezoelectric material 302 may be fabricated directly on the first electrode 204. In some embodiments, though not shown, the piezoelectric material 302 may be fabricated with one or more intervening materials between the first electrode 204 and the piezoelectric material 302. For example, the resonator 200 may include one or more seed layers to facilitate the fabrication of the piezoelectric material 302. For instance, the resonator 200 may include a polarization-determining seed layer (PDSL) to provide a C-axis vector 304 with a selected initial direction. The use of a PDSL to control an initial direction of a C-axis vector 304 of a piezoelectric material is described generally in U.S. Pat. No. 9,847,768, which is referenced above and incorporated herein by reference in its entirety.

In some embodiments, the method 100 includes a step 106 of applying an electric field across the piezoelectric material 302 to modify the direction of the C-axis vector 304. The C-axis vector 304 may be modified to have any direction different than the initial direction. Accordingly, an orientation of the C-axis of the piezoelectric material 302 and/or whether the piezoelectric material 302 is compression positive or negative may be modified through application of the electric field. In some embodiments, the C-axis vector 304 is modified to have a direction antiparallel to the initial direction. In this way, modification of the C-axis vector 304 may flip the piezoelectric material 302 from compression positive to compression negative (or vice versa) along the initial C-axis (here the Z-axis). As will be described in greater detail below, it is contemplated herein that modifying the C-axis vector 304 to be antiparallel to an initial direction may facilitate the fabrication of stacked resonators having antiparallel C-axis vectors 304 to provide cancellation of higher-order resonant modes (e.g., cancellation of second-order resonant modes) and high electromechanical coupling metrics.

The step 106 may be carried out using any technique suitable for modifying the direction of the C-axis vector 304 such as, but not limited to, applying a voltage between two electrodes on opposing sides of the piezoelectric material 302. For example, a voltage may be applied between the first electrode 204 and an additional electrode located on an opposing side of the piezoelectric material 302.

Referring now to FIGS. 4A-5B, in some embodiments, a second electrode 402 is placed on or proximate to the piezoelectric material 302 on a side opposing the first electrode 204 and is subsequently used to apply an electric field across the piezoelectric material 302 for modification of the direction of its C-axis vector 304. For example, the step 106 of the method 100 may include applying a voltage between the second electrode 402 and the first electrode 204 to generate an electric field across the piezoelectric material 302 suitable for modifying its C-axis vector 304.

Figure 4B:
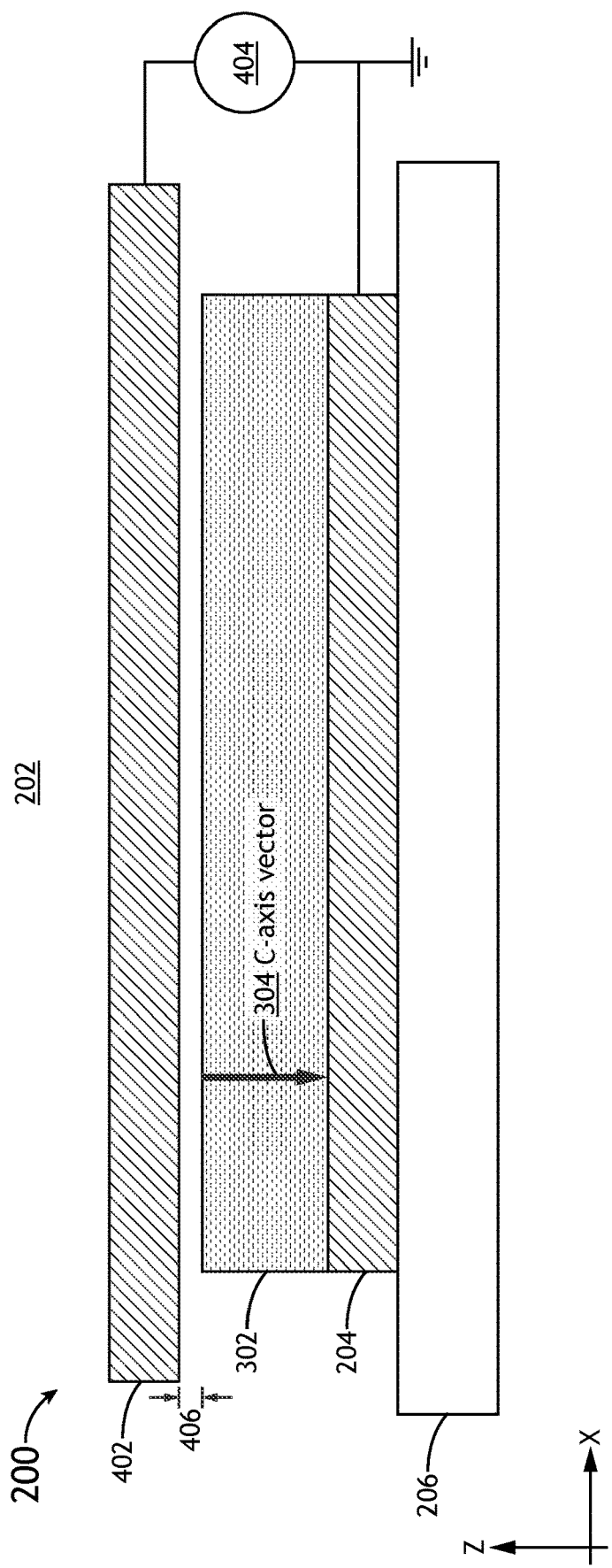
FIG. 4B is a simplified side view of a portion of a resonator along with a second electrode formed as a conductive plate separated from the piezoelectric material by a gap, in accordance with one or more embodiments of the present disclosure.
Figure 4C:
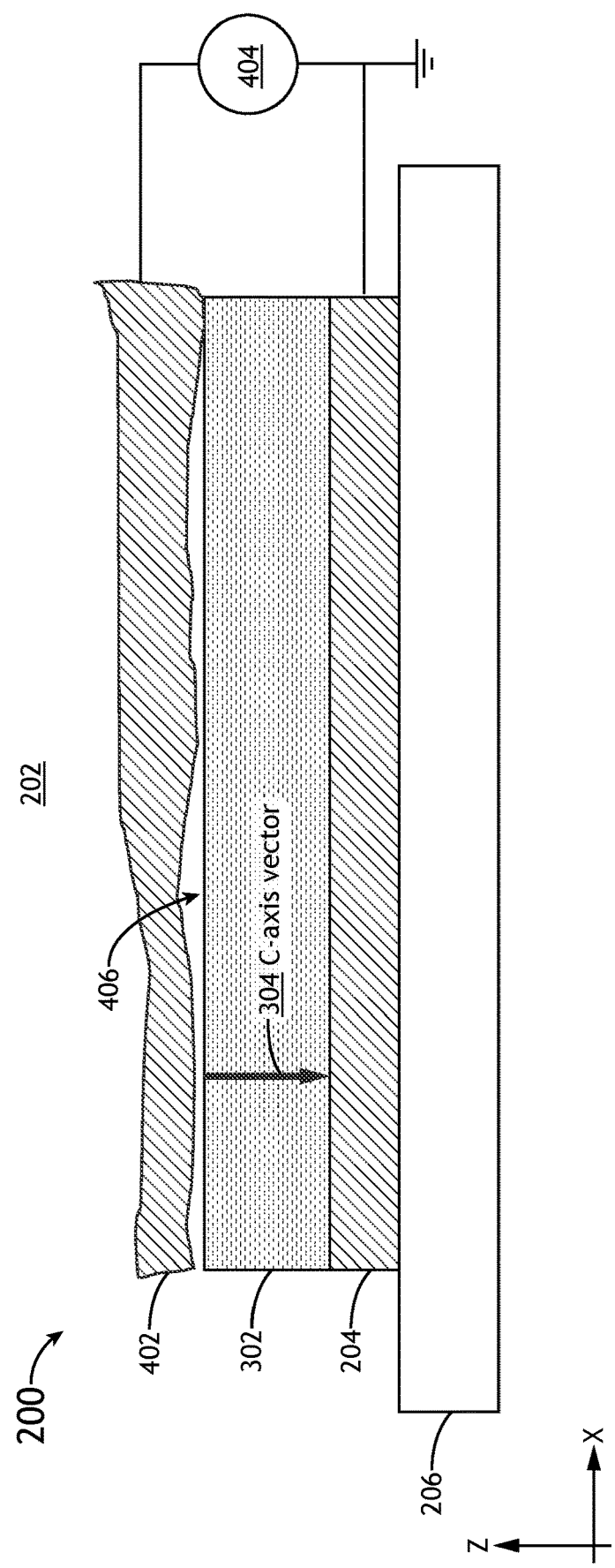
FIG. 4C is a simplified side view of a portion of a resonator along with a second electrode formed as a pliant conductive material in partial contact with the piezoelectric material, in accordance with one or more embodiments of the present disclosure.

FIGS. 4A-4C illustrate various non-limiting embodiments of the modification of the C-axis vector 304 of the piezoelectric material 302 by application of a voltage between the second electrode 402 and the first electrode 204. For example, FIGS. 4A-4C depict a source 404 (e.g., a voltage source, or the like) connected to the second electrode 402 and the first electrode 204 and further depict the C-axis vector 304 oriented along the −Z direction (e.g., antiparallel to the +Z direction illustrated in FIG. 3) to indicate that the piezoelectric material 302 is now compression negative along the Z-axis. The source 404 may be connected to the second electrode 402 and the first electrode 204 in any configuration to provide any voltage of any polarity suitable for modifying the C-axis vector 304 of the piezoelectric material 302. As illustrated in FIGS. 4A-4C, the first electrode 204 may be connected to ground and the source 404 may apply a desired voltage to the second electrode 402 relative to ground. As another example, the source 404 may apply a voltage between the second electrode 402 and the first electrode 204 without reference to an external ground.

The values of an electric field and/or a voltage required to modify the C-axis vector 304 may depend on various factors such as, but not limited to, a composition or thickness of the piezoelectric material 302, as well as any intervening layers. For example, a voltage of approximately 70 V may be suitable for modifying the C-axis vector 304 of ASN having approximately 35% scandium. As another example, a voltage of approximately 100 V may be suitable for modifying the C-axis vector 304 of ASN having approximately 22% scandium. However, as described previously herein, it is to be understood that these values are illustrative only and should not be interpreted as limiting. Any value of the electric field and/or voltage suitable for modifying the C-axis vector 304 may be applied. Further, it may be the case that a range of electric fields and/or voltages are suitable for modifying the C-axis vector 304 for a given composition of the piezoelectric material 302.

In some embodiments, the second electrode 402 is formed from components that are separate from (e.g., independent of) the resonator 200. In this way, the second electrode 402 may be temporarily placed on or near the piezoelectric material 302 to assist in the modification of its C-axis vector 304 without itself being fabricated as a layer. Further, the second electrode 402 may be any electrically-conductive material suitable for operating as an electrode for the application of a voltage across the piezoelectric material 302 such as, but not limited to, a metal.

For example, the second electrode 402 may include a conductive plate that may be placed on or near the piezoelectric material 302. FIG. 4A is a simplified side view of a portion of a resonator 200 along with a second electrode 402 formed as a conductive plate placed in contact with the piezoelectric material 302, in accordance with one or more embodiments of the present disclosure. FIG. 4B is a simplified side view of a portion of a resonator 200 along with a second electrode 402 formed as a conductive plate separated from the piezoelectric material 302 by a gap 406, in accordance with one or more embodiments of the present disclosure. It is contemplated herein that the piezoelectric material 302 may typically have a sufficiently high dielectric constant (e.g., relative permittivity) that application of a voltage between the second electrode 402 and the first electrode 204 will result in a relatively stronger electric field across the piezoelectric material 302 than across the gap 406.

As another example, the second electrode 402 may include a pliant conductive material such as, but not limited to, a plunger that may be placed in at least partial contact with the piezoelectric material 302. FIG. 4C is a simplified side view of a portion of a resonator 200 along with a second electrode 402 formed as a pliant conductive material in partial contact with the piezoelectric material 302, in accordance with one or more embodiments of the present disclosure. As in the case illustrated in FIG. 4B, the relatively high dielectric constant of the piezoelectric material 302 relative to the ambient atmosphere may result in a relatively higher electric field across the piezoelectric material 302. Further, as described previously herein, it may be the case that a range of electric field values may be suitable for modifying the C-axis vector 304 of the piezoelectric material 302 such that variation of the electric field across the piezoelectric material 302 caused by partial or uneven contact between the second electrode 402 and the piezoelectric material 302 may be negligible or at least within acceptable tolerances.

In some embodiments, a second electrode 402 is formed as a conductive layer of material fabricated directly on one or more additional components of the resonator 200 such as, but not limited to, the piezoelectric material 302.

Figure 1B:
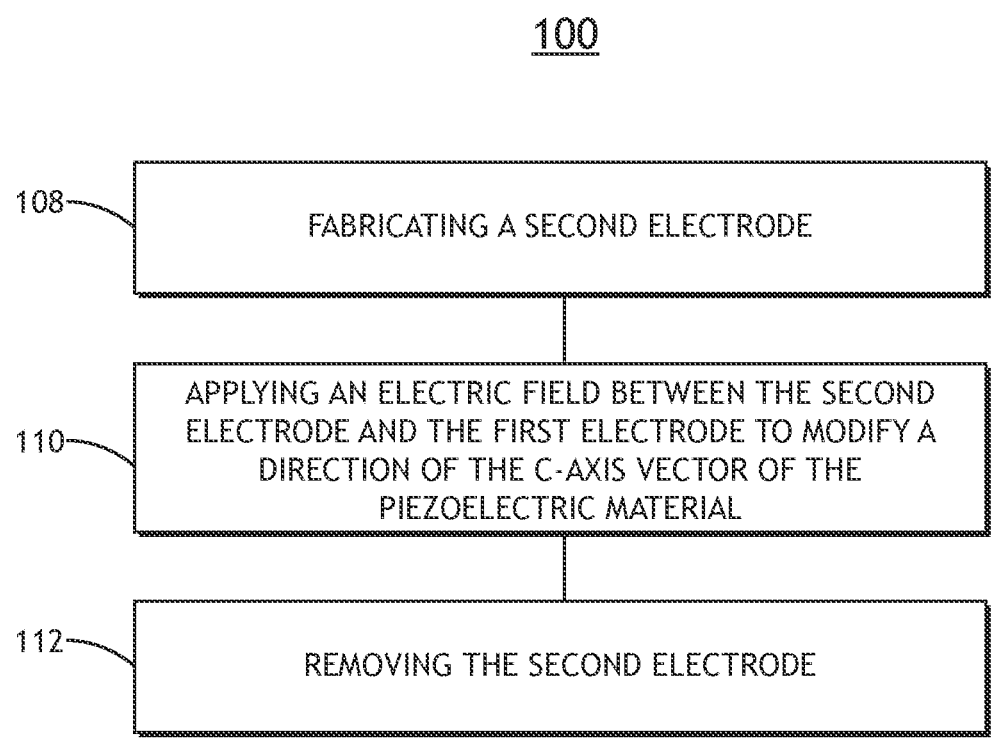
FIG. 1B is a flow diagram depicting one technique for applying an electric field across the piezoelectric material to modify a direction of its compression axis (C-axis) vector, in accordance with one or more embodiments of the present disclosure.
Figure 5A:
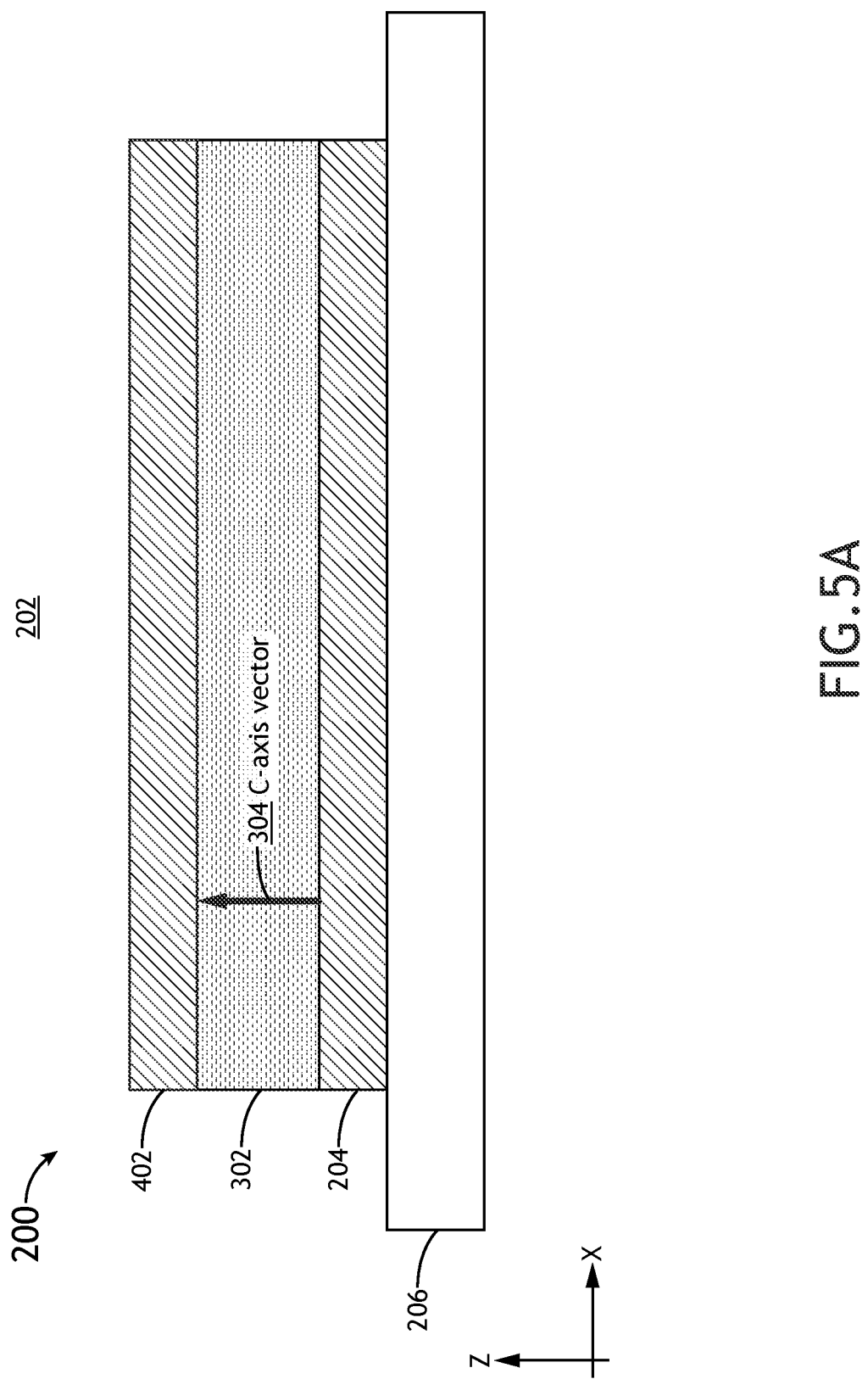
FIG. 5A is a simplified side view of a portion of a resonator including the second electrode prior to modification of the C-axis vector, in accordance with one or more embodiments of the present disclosure.
Figure 5B:
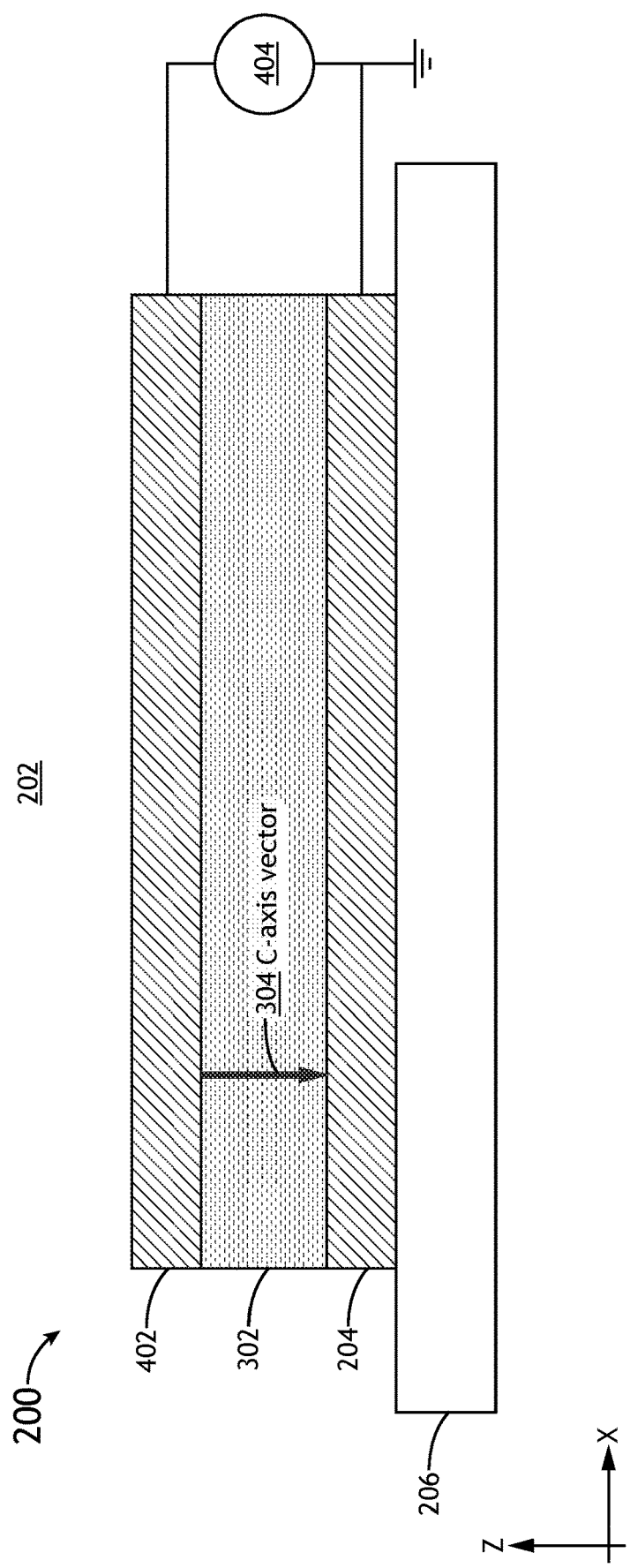
FIG. 5B is a simplified side view of a portion of a resonator including the second electrode after modification of the C-axis vector, in accordance with one or more embodiments of the present disclosure.

FIG. 1B is a flow diagram depicting one technique for applying an electric field across the piezoelectric material 302 to modify a direction of its C-axis vector 304, in accordance with one or more embodiments of the present disclosure. FIG. 5A is a simplified side view of a portion of a resonator 200 including the second electrode 402 prior to modification of the C-axis vector 304, in accordance with one or more embodiments of the present disclosure. FIG. 5B is a simplified side view of a portion of a resonator 200 including the second electrode 402 after modification of the C-axis vector 304, in accordance with one or more embodiments of the present disclosure.

In some embodiments, the method 100 includes a step 108 of fabricating a second electrode 402. For example, the second electrode 402 may be fabricated on an opposing side of the piezoelectric material 302 as the first electrode 204. The second electrode 402 may be fabricated to be in direct physical contact with the piezoelectric material 302 or there may be intervening layers between the piezoelectric material 302 and the second electrode 402. The second electrode 402 may be formed from any suitable conductive material including, but not limited to, molybdenum (Mo) or tungsten (W).

In some embodiments, the method 100 includes a step 110 of applying an electric field between the second electrode 402 and the first electrode 204 to modify a direction of the C-axis vector 304. For example, the step 110 may be carried out by applying a voltage between the second electrode 402 and the first electrode 204 as illustrated in FIG. 5B.

In some embodiments, the method 100 includes a step 112 of removing the second electrode 402. The second electrode 402 may be removed using any technique known in the art including, but not limited to, etching. As described in greater detail below, in some embodiments, the second electrode 402 may be removed in step 112 after modification of the C-axis vector 304 of the piezoelectric material 302 to accommodate resonator designs without an intervening electrode. Alternatively, in some embodiments, the step 112 is omitted and the second electrode 402 is retained in full or part as a component of the resonator 200 to accommodate additional resonator designs.

Referring again generally to FIGS. 1A-1C, various non-limiting considerations and approaches for applying a voltage between the second electrode 402 and the first electrodes 204 to modify the C-axis vector 304 of the piezoelectric material 302 are described in greater detail in accordance with one or more embodiments of the present disclosure. It is noted that applying a voltage between the second electrode 402 and the first electrode 204 requires establishing an electrical connection between each of these electrodes and the source 404.

In some embodiments, the method 100 includes connecting leads from a source 404 to the first electrode 204 and/or the second electrode 402 to provide a voltage between the first electrode 204 and the second electrode 402 for modification of the C-axis vector 304 of the piezoelectric material 302. For example, the first electrode 204 and/or the second electrode 402 may be readily accessible in some designs such that leads may directly contact the first electrode 204 and/or the second electrode 402. As one illustration, the second electrode 402 may be configured as an independent electrode (e.g., as illustrated in FIGS. 4A-4C) and may be directly connected to the source 404. As another illustration, the first electrode 204 and/or the second electrode 402 (e.g., as a fabricated conductive layer of material as illustrated in FIGS. 5A-5B) may be connected to the source 404 through one or more leads placed in direct contact with the first electrode 204 and/or the second electrode 402.

In some embodiments, the method 100 includes connecting the first electrode 204 and/or the second electrode 402 to the source 404 using one or more electrical pathways to an electrical contact. As used herein, an electrical pathway may include any number of electrically-conductive components suitable for providing an electrical connection between two objects and may include, but is not limited to, a wire, an electrical trace (e.g., an electrically-conductive path on a circuit board), a pad, an electrically-conductive seal ring 212 (e.g., as illustrated in FIG. 2B), or an electrical grid (e.g., a series of electrical traces in the alleys 210 between dies 208 providing electrical connections between components such as, but not limited to, seal rings 212). Further, in an application in which multiple resonators 200 with modified C-axis vector 304 directions are to be fabricated, it may be desirable to provide electrical pathways between common electrodes (e.g., between multiple first electrodes 204 and/or between multiple second electrodes 402) such that the C-axis vector 304 directions of the various piezoelectric materials 302 may be modified simultaneously. An electrical contact may include any electrically-conductive component that is physically accessible to the source 404 (or a lead attached to the source 404) such as, but not limited to, a conductive pad or plate.

In this way, the method 100 may include fabricating one or more electrical pathways to the first electrode 204 and/or the second electrode 402 that are accessible to the source 404 prior to modifying the C-axis vector 304 direction of the piezoelectric material 302.

After modifying the C-axis vector 304 of the piezoelectric material 302, the electrical pathways and/or the electrical pad may optionally be severed or otherwise destroyed. In this way, the piezoelectric material 302 that forms a portion of a complete resonator 200 may be connected in an electrical circuit to additional components using different electrical connections than used to modify the C-axis vector 304 of the piezoelectric material 302.

Referring now to FIGS. 1C and 6A-6C, the fabrication of electrical pathways to provide an electrical connection to the piezoelectric material 302 is described in accordance with one or more embodiments of the present disclosure.

Figure 1C:
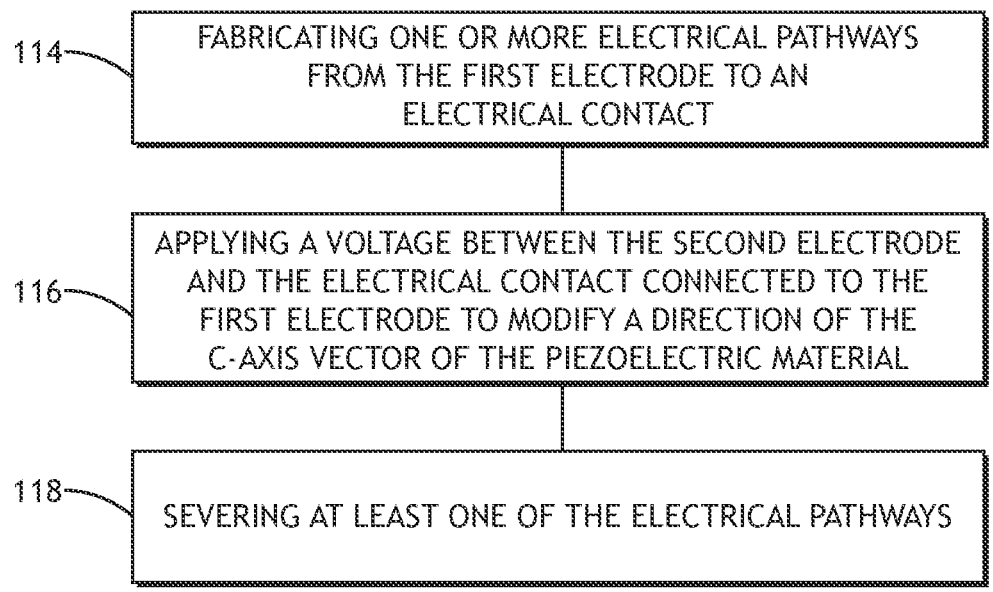
FIG. 1C is a flow diagram depicting additional steps of the method related to providing an electrical connection to the piezoelectric material, in accordance with one or more embodiments of the present disclosure.
Figure 6B:
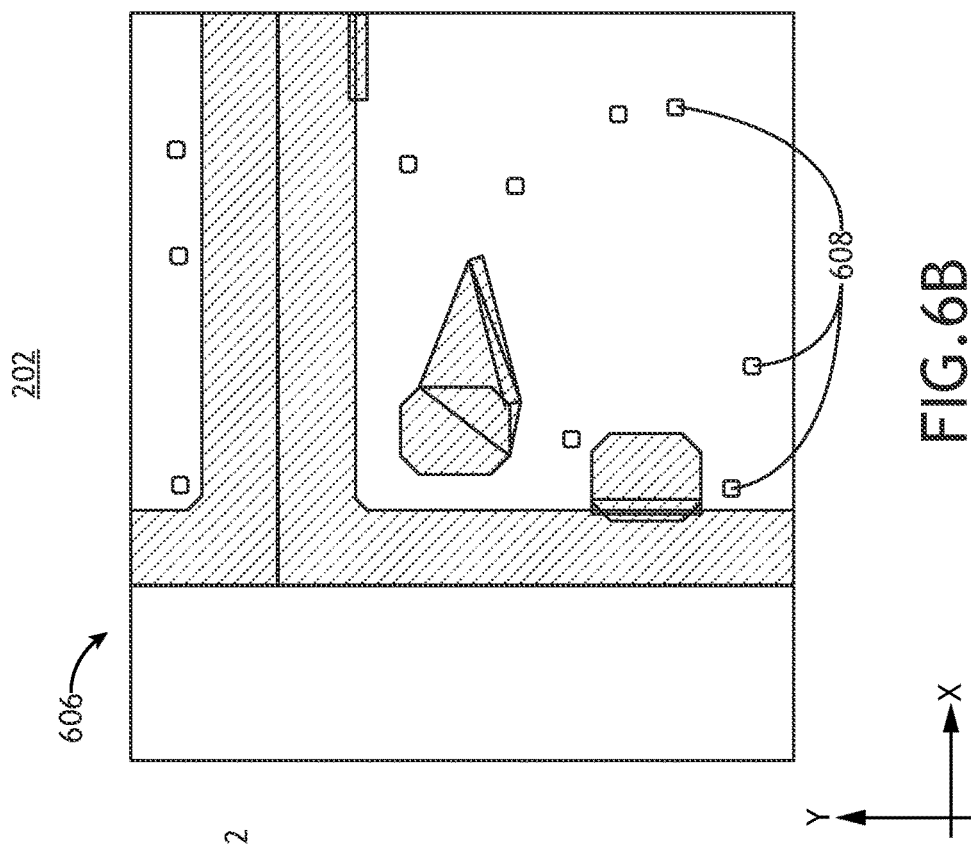
FIG. 6B depicts a photomask for etching through at least the piezoelectric material that includes various holes to be etched, where at least some of the holes are aligned with electrical pathways to be severed, in accordance with one or more embodiments of the present disclosure.
Figure 6A:
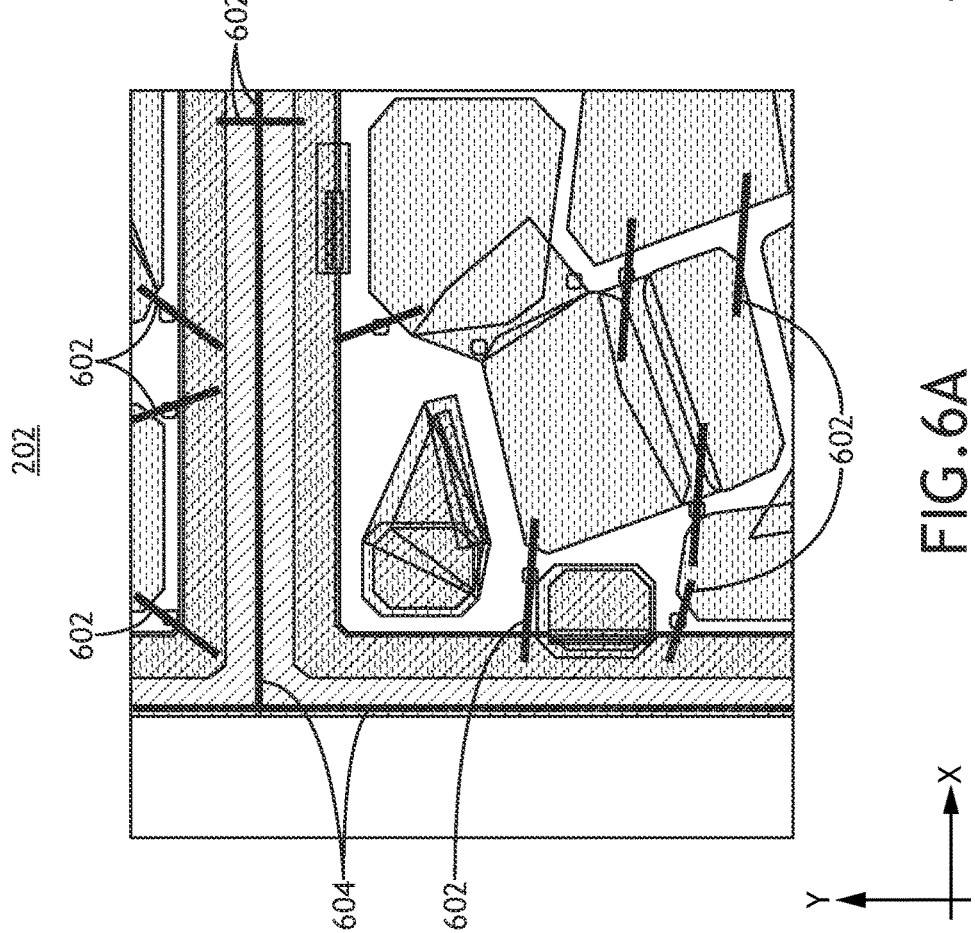
FIG. 6A is a top view of a sample corresponding to a portion of FIG. 2A depicting multiple first electrodes and electrical pathways, in accordance with one or more embodiments of the present disclosure.
Figure 6C:
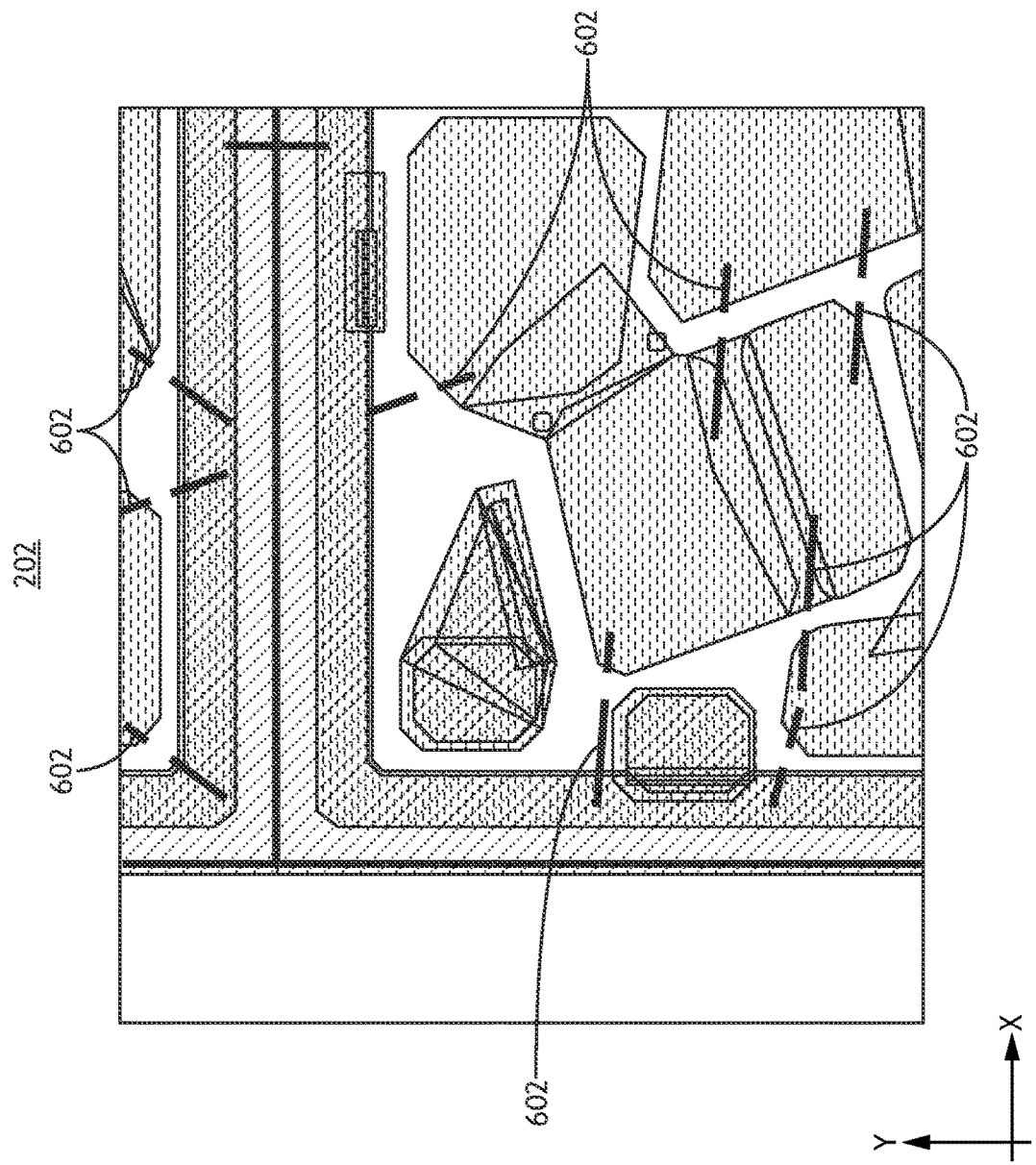
FIG. 6C depicts a top view of the sample depicting severed electrical pathways resulting from etching with the photomask in FIG. 6B, in accordance with one or more embodiments of the present disclosure.

FIG. 1C is a flow diagram depicting additional steps of the method 100 related to providing an electrical connection to the first electrode 204, in accordance with one or more embodiments of the present disclosure. FIGS. 6A-6C illustrate a sample 202 at various fabrication steps associated with the method 100.

In some embodiments, the method 100 includes a step 114 of fabricating one or more electrical pathways 602 from the first electrode 204 to an electrical contact.

FIG. 6A is a top view of a sample 202 corresponding to a portion of FIG. 2A depicting multiple first electrodes 204 and electrical pathways 602, in accordance with one or more embodiments of the present disclosure. In particular, the electrical pathways 602 in FIG. 6A are depicted as electrical traces between the first electrodes 204 to a seal ring 212 for each of the dies 208 as well as electrical traces between the seal rings 212 and an electrical grid 604 in the alleys 210. In this way, the various first electrodes 204 across the sample 202 may all be electrically connected to each other. Further, any of these electrically-connected elements may form an electrical contact suitable for connection to the source 404. In some embodiments, though not shown, a separate electrical contact (e.g., a conductive pad, or the like) may be fabricated.

The step 114 of fabricating one or more electrical pathways 602 from the first electrode 204 to an electrical contact may be carried out in any suitable sequence in the method 100. In some embodiments, the step 114 is carried out simultaneously with the step 102 of fabricating the first electrode 204. For example, the electrical pathways 602 may be provided in a fabrication design of one or more first electrodes 204.

In some embodiments, the method 100 includes a step 116 of applying a voltage between the second electrode 402 and the electrical contact connected to the first electrode 204 (e.g., any component electrically connected to the first electrodes 204 in FIG. 6A) to modify a direction of the C-axis vector 304 of the piezoelectric material 302. For example, the step 116 may be performed after the step 108 of fabricating the second electrode 402.

In some embodiments, the method 100 includes a step 118 of severing at least one of the electrical pathways 602 subsequent to modifying the direction of the C-axis vector 304 of the piezoelectric material 302. This may allow the first electrodes 204 (and the fully-formed resonators 200 more generally) to be connected in any suitable electrical circuit design.

The step 118 may be carried out using any technique known in the art suitable for breaking the electrical connection between connected components. In some embodiments, one or more of the electrical pathways 602 may be accessible after deposition of the piezoelectric material 302 and/or the second electrode 402. In these configurations, the electrical pathways 602 may be severed using any suitable process including, but not limited to, the application of mechanical force or etching. In some embodiments, one or more of the electrical pathways 602 may be buried beneath one or more material layers (e.g., the piezoelectric material 302, the second electrode 402, or the like). In these configurations, the electrical pathways 602 may be severed using any suitable process including, but not limited to, etching a hole through material layers above the electrical pathways 602 and further etching at least a portion of the electrical pathways 602 (e.g., using the same or different etching agents).

As an illustration, FIG. 6B depicts a photomask 606 for etching through at least the piezoelectric material 302 that includes various holes 608 to be etched, where at least some of the holes 608 are aligned with electrical pathways 602 to be severed, in accordance with one or more embodiments of the present disclosure. FIG. 6C depicts a top view of the sample 202 depicting severed electrical pathways 602 resulting from etching with the photomask 606 in FIG. 6B, in accordance with one or more embodiments of the present disclosure. Additionally, though not explicitly illustrated, electrical pathways 602 between dies 208 such as, but not limited to, electrical pathways 602 between seal rings 212 and the electrical grid 604 or the electrical grid 604 itself may be severed when the fabricated dies 208 are singulated.

Referring generally to FIGS. 2 and 6A-6C, it is to be understood that FIGS. 2 and 6A-6C are provided solely for illustrative purposes and should not be interpreted as limiting. For example, a sample 202 may include any number, shape, or orientation of first electrodes 204 or electrical pathways 602. Further, the sample 202 need not include all illustrated components such as, but not limited to, seal rings 212 or an electrical grid 604 in the alleys 210.

Figure 1D:
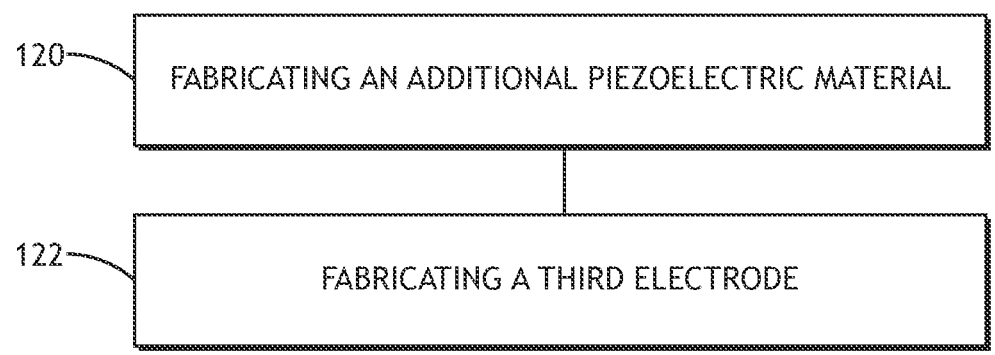
FIG. 1D is a flow diagram depicting additional steps of the method related to fabrication of a resonator with a stacked structure, in accordance with one or more embodiments of the present disclosure.
Figure 7:
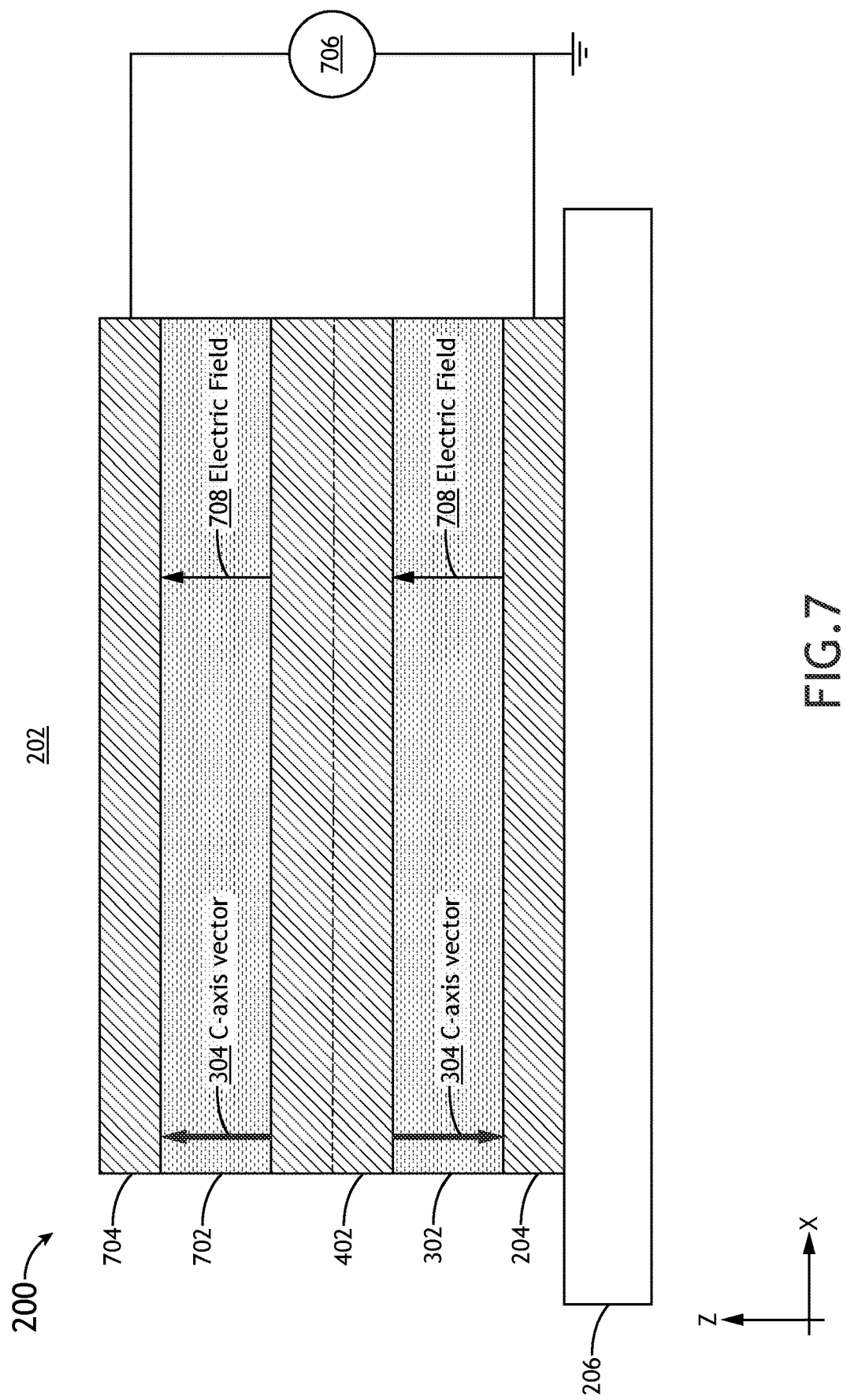
FIG. 7 is a simplified side view of a resonator including two piezoelectric materials with antiparallel C-axis vector directions and an intermediate electrode, in accordance with one or more embodiments of the present disclosure.
Figure 8:
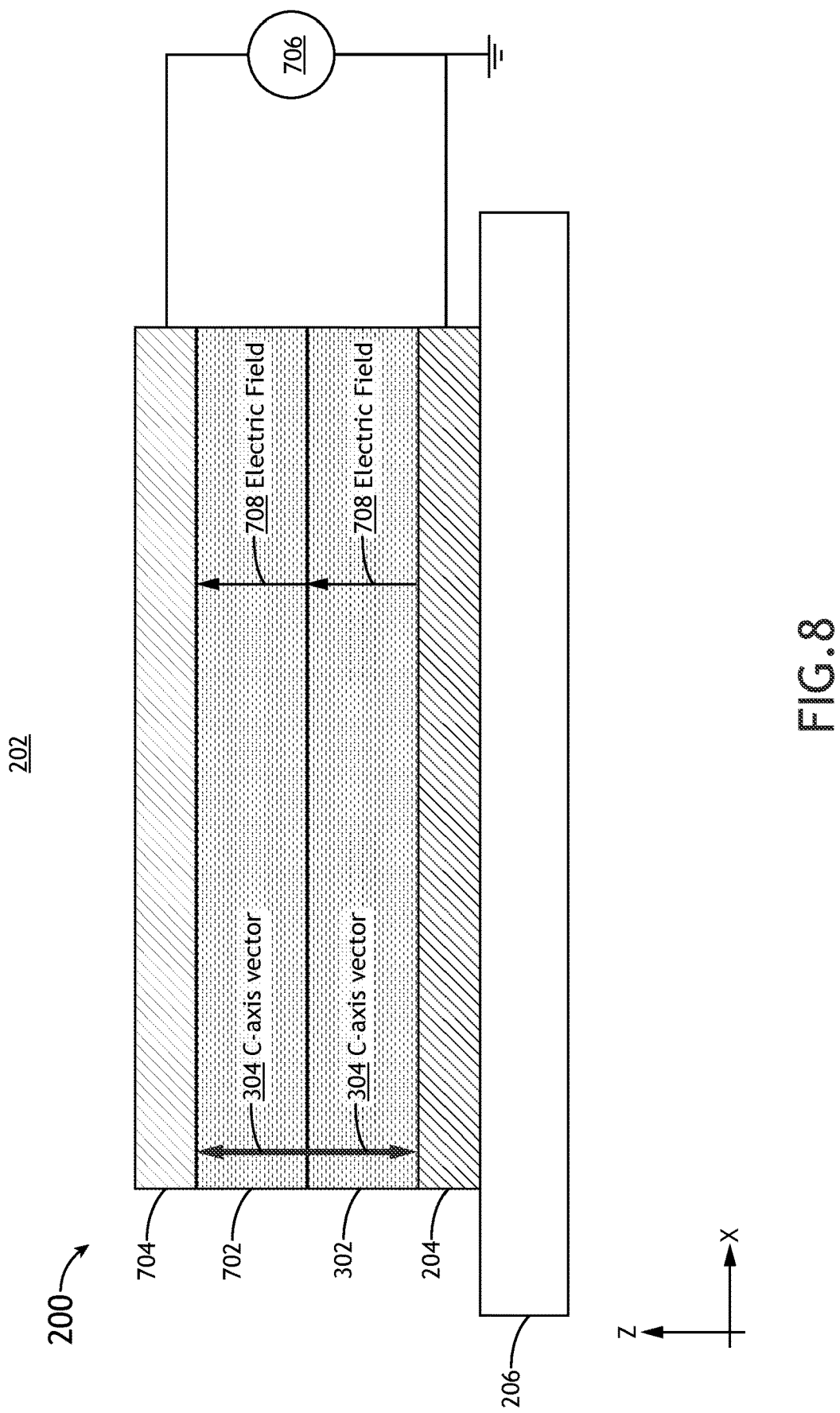
FIG. 8 is a simplified side view of a resonator including two piezoelectric materials with antiparallel C-axis vector directions and without an intermediate electrode, in accordance with one or more embodiments of the present disclosure.

Referring now to FIGS. 1D and 7-8, the fabrication of a resonator 200 including the piezoelectric material 302 with a modified C-axis vector 304 is described in greater detail, in accordance with one or more embodiments of the present disclosure. It is contemplated herein that the method 100 may enable the fabrication of a wide variety of resonator designs in which constituent piezoelectric materials may be fabricated under conditions suitable for high electromechanical coupling, and in which the C-axis vectors 304 of any of the constituent piezoelectric materials may be subsequently modified as needed for a particular resonator design.

After modification of the C-axis vector 304 of the piezoelectric material 302, the second electrode 402, if fabricated over the piezoelectric material 302 as illustrated in FIGS. 5A and 5B, may either be at least partially retained and utilized as an operational component of the resonator 200 or may be removed (e.g., as provided in step 112 in FIG. 1B). In applications where the second electrode 402 is an independent component and not fabricated as a layer at least temporarily part of a resonator 200, the second electrode 402 may simply be removed in subsequent steps.

In some embodiments, the second electrode 402 may form an operational component of a resonator 200 after modification of the C-axis vector 304 of the piezoelectric material 302.

For example, the resonator 200 depicted in FIGS. 5A and 5B with the second electrode 402 retained may be an FBAR. In this way, FIGS. 5A and 5B depict FBAR resonators with different C-axis vectors 304 using the same fabrication process for the piezoelectric material 302. Although not shown, the second electrode 402 may additionally be patterned either before or after the modification of the C-axis vector 304 of the piezoelectric material 302.

In some embodiments, one or more additional material layers are fabricated over the piezoelectric material 302 and optionally the second electrode 402. For example, one or more additional piezoelectric materials and one or more additional electrodes may be fabricated over the second electrode 402 to form a resonator 200 with a stacked structure such as, but not limited to, a DBAR, an SBAR, or an RSBAR. Stacked resonator designs are described generally in U.S. Pat. No. 7,889,024 issued on Feb. 15, 2011, U.S. Pat. No. 9,847,768 issued Dec. 19, 2017, and U.S. Patent Publication No. 2009/0079514 published on Mar. 26, 2019, all of which are incorporated herein by reference in their entireties.

In some embodiments, a resonator 200 includes an additional piezoelectric material having a C-axis vector 304 oriented antiparallel to the modified C-axis vector 304 of a first piezoelectric material 302. For example, the additional piezoelectric material may be fabricated using the same process as the first piezoelectric material 302 and may thus have matching electromechanical properties but different C-axis vectors 304.

FIG. 1D is a flow diagram depicting additional steps of the method 100 related to fabrication of a resonator 200 with a stacked structure, in accordance with one or more embodiments of the present disclosure.

In some embodiments, the method 100 includes a step 120 of fabricating an additional piezoelectric material. The step 120 of fabricating an additional piezoelectric material may be performed using any technique known in the art including, but not limited to, a sputtering technique. The additional piezoelectric material may have any C-axis vector 304 direction such as, but not limited to, a direction antiparallel to the modified C-axis vector 304 of the piezoelectric material 302. For example, in applications in which the second electrode 402 is formed as a layer (e.g., as illustrated in FIG. 1B) and retained in full or in part after modification of the C-axis vector 304, the additional piezoelectric material may be fabricated over the piezoelectric material 302 with or without intervening layers. As another example, in applications in which the second electrode 402 is removed or independent from the resonator 200, the additional piezoelectric material may be fabricated over the second electrode 402 with or without intervening layers.

In some embodiments, the method 100 includes a step 122 of fabricating a third electrode (e.g., over the additional piezoelectric material). For example, the third electrode may be fabricated to be in direct contact with the additional piezoelectric material. As another example, one or more intervening layers may be fabricated between the additional piezoelectric material and the third electrode. The third electrode may thus form another operational electrode of the resonator.

FIG. 7 is a simplified side view of a resonator 200 including two piezoelectric materials with antiparallel C-axis vectors 304 and an intermediate electrode, in accordance with one or more embodiments of the present disclosure. For example, the resonator 200 illustrated in FIG. 7 may correspond to FIG. 5B plus an additional piezoelectric material 702 and a third electrode 704. Accordingly, the resonator 200 illustrated in FIG. 5B may be characterized as two stacked FBARs having antiparallel C-axis vectors 304. In this configuration, the second electrode 402 is retained as an intermediate electrode, which may be suitable for, but is not limited to, operation of the resonator 200 in a differential mode. The additional piezoelectric material 702 may thus be fabricated either directly on the second electrode 402 or on one or more intervening layers.

FIG. 8 is a simplified side view of a resonator 200 including two piezoelectric materials with antiparallel C-axis vectors 304 and without an intermediate electrode, in accordance with one or more embodiments of the present disclosure. For example, the resonator 200 illustrated in FIG. 8 may correspond to FIG. 4C after the independent second electrode 402 is taken away or FIG. 5B after removal of the second electrode 402. The additional piezoelectric material 702 may thus be fabricated either directly on the piezoelectric material 302 or on one or more intervening layers.

FIGS. 7 and 8 further depict non-limiting examples of the operation of the resonator 200. In particular, FIGS. 7 and 8 depict a configuration in which the first electrode 204 is connected to ground and a source 706 is connected to the third electrode 704 to apply a signal (e.g., an RF signal) to the third electrode 704 with respect to ground. In this configuration, the electric field 708 is pointed in a common direction in both the piezoelectric material 302 and the additional piezoelectric material 702 while the C-axis vectors 304 are antiparallel. However, it is to be understood that the resonator 200 may be connected in any configuration suitable for a desired application and the connections herein are merely illustrative.

Referring generally to FIGS. 7 and 8, it is to be understood that FIGS. 7 and 8 and the associated descriptions are provided solely for illustrative purposes and should not be interpreted as limiting. A resonator 200 may generally include any number of piezoelectric materials in any arrangement, where a C-axis vector of at least one of the piezoelectric materials is modified through application of an electric field. Further, this piezoelectric material with a modified C-axis vector may be fabricated at any location within the resonator 200.

For example, the resonator 200 having a final structure as illustrated in FIG. 7 may be formed by fabricating the first electrode 204, the piezoelectric material 302, the second electrode 402, the additional piezoelectric material 702, and the third electrode 704 such that the piezoelectric material 302 and the additional piezoelectric material 702 both have initial C-axis vectors 304 oriented along the −Z direction. Subsequently, the C-axis vector 304 of the additional piezoelectric material 702 may be modified to the +Z direction by application of a voltage between the second electrode 402 and the third electrode 704.

As another example, a resonator 200 may include more than two piezoelectric layers either with or without intervening electrodes. In this way, a resonator 200 with any design in which at least one constituent piezoelectric layer is modified through the application of an electric field is within the spirt and scope of the present disclosure.

It is contemplated herein that a resonator 200 having a stacked structure formed from two piezoelectric materials with opposing (e.g., antiparallel) C-axis vectors 304 such as, but not limited to, the illustrations in FIGS. 7 and 8, may provide numerous benefits over alternative resonator designs. As an illustration, such designs may present an alternative to multiple conventional FBAR devices (e.g., as illustrated in FIG. 5) connected in parallel.

For example, such a design may beneficially suppress or otherwise cancel out various harmonic resonant modes including, but not limited to, second harmonic modes that may be undesirable in some applications. In particular, the antiparallel orientations of the C-axis vectors 304 of the constituent piezoelectric materials (e.g., the piezoelectric material 302 and the additional piezoelectric material 702) may result in antiparallel oscillations that suppress at least second harmonic modes more effectively than in alternative designs.

As another example, such a design may promote relatively thicker electrodes than conventional FBAR devices for a particular operational frequency. In particular, since the combined thickness of the piezoelectric layers (e.g., the piezoelectric material 302 and the additional piezoelectric material 702) of a resonator 200 as disclosed herein is greater than (e.g., twice as thick as) piezoelectric layers in a conventional FBAR device, relatively thicker electrodes are needed to provide the same operational frequency as for a conventional FBAR device.

It is contemplated herein that sheet resistance, which increases as electrodes become thinner, is a significant contributor to operational losses (e.g., attenuation). As a result, the relatively thicker electrodes associated with this design promote reduced sheet resistance and a reduction of associated losses for a particular operational frequency. Alternatively, the relatively thicker electrodes associated with this design enable efficient scaling to higher frequency bands. For example, scaling a resonator design to higher frequencies typically involves reducing the thicknesses of constituent materials such as electrodes. In addition to sheet resistance losses, practical limitations on minimum electrode thickness become a barrier to high-frequency operation. However, the systems and methods disclosed herein may enable scaling to higher frequencies than alternative designs. In some embodiments, the systems and methods disclosed herein are suitable for a resonator 200 that operates at a frequency equal to or greater than 6 GHz, which is challenging with conventional designs. For example, such a resonator 200 may have one or more resonant frequencies equal to or greater than 6 GHz. In this way, such a resonator 200 may be used in a filter or other circuit suitable for receiving signals with frequencies equal to or greater than 6 GHz.

It is further contemplated that the systems and methods disclosed herein facilitate various benefits over resonators with similar designs that are fabricated using different techniques. For example, techniques for fabricating resonators 200 with opposing C-axis vectors 304 such as, but not limited to, those illustrated in FIGS. 7 and 8 by directly fabricating piezoelectric layers with opposing C-axis vectors 304 may suffer from mismatched electromechanical and/or thermal properties or inconsistent fabrication quality between the different processes.

In contrast, the systems and methods disclosed herein facilitate fabrication of multiple piezoelectric materials (herein described as the piezoelectric material 302 and the additional piezoelectric material 702) with a common fabrication process to provide initial C-axis vectors 304 along a common direction. In this way, the orientation of the initial C-axis vectors 304 and/or the fabrication process for the piezoelectric materials may be selected to provide desirable properties such as, but not limited to, electromechanical properties or thermal properties. Further, the various properties of the different piezoelectric layers may be effectively matched to provide efficient suppression of undesirable harmonics.

Figure 9:
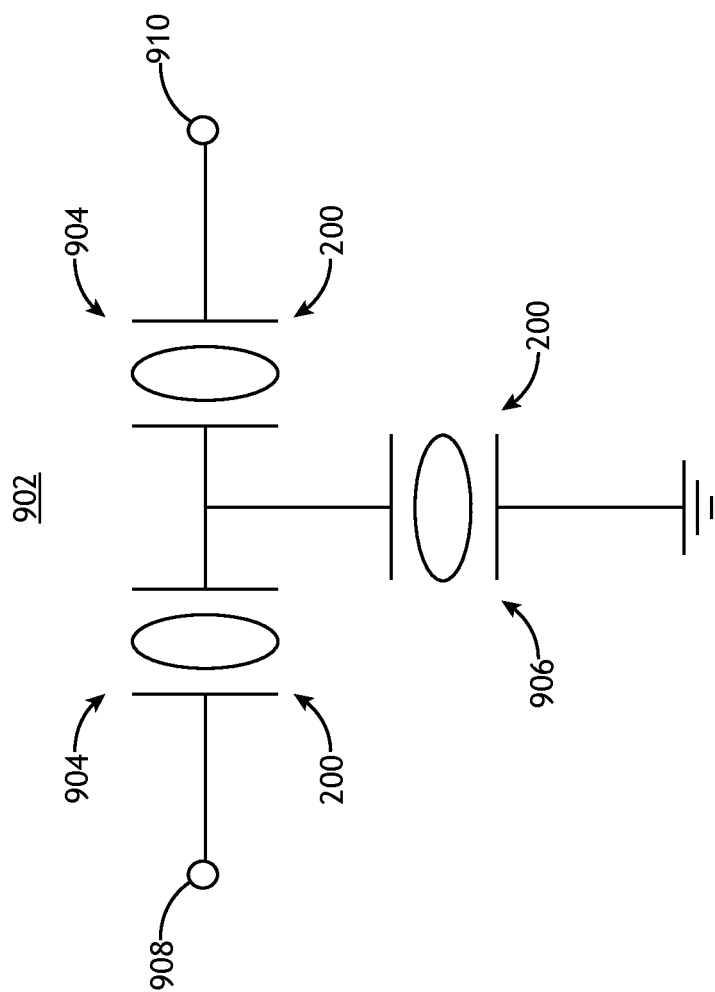
FIG. 9 is a simplified schematic diagram of a filter including multiple resonators in which at least one of the resonators has a modified C-axis vector, in accordance with one or more embodiments of the present disclosure.

Referring now to FIG. 9, a circuit including one or more resonators 200 are described in greater detail, in accordance with one or more embodiments of the present disclosure. It is contemplated herein that one or more resonators 200 having modified C-axis vectors 304 may be used within any suitable type of circuit (e.g., electrical circuit) suitable for any application including, but not limited to, filters, RF communication systems, or sensors. In this way, a circuit may include at least one resonator 200 having a modified C-axis vector 304 and any number of additional components including, but not limited to, additional resonators fabricated using other techniques, passive components (e.g., resistors, capacitors, inductors, or the like), or active components (e.g., amplifiers, or the like).

FIG. 9 is a simplified schematic diagram of a filter 902 including multiple resonators 200 in which at least one of the resonators has a modified C-axis vector 304, in accordance with one or more embodiments of the present disclosure. In particular, FIG. 9 depicts a filter 902 including two series resonators 904 and a shunt resonator 906. For example, the series resonators 904 are in series between an input terminal 908 and an output terminal 910, while the shunt resonator 906 is connected between ground and a node between any of the series resonators 904. It is contemplated herein that the filter 902 may operate as a band-pass filter or a band-reject filter (e.g., a notch filter, a bandstop filter, or the like) depending on resonance frequencies of the shunt resonator 906. In some embodiments, the filter 902 includes at least one resonator 200 having at least one piezoelectric material 302 with a modified C-axis vector 304. For example, in FIG. 9, the series resonators 904 and the shunt resonator 906 are all formed as resonators 200 having at least one piezoelectric material 302 with a modified C-axis vector 304.

It is to be understood that FIG. 9 and the associated description is provided solely for illustrative purposes and should not be interpreted as limiting. For example, the filter 902 may include any number of series resonators 904 or shunt resonator 906. More generally, at least one resonator 200 having at least one piezoelectric material 302 with a modified C-axis vector 304 as disclosed herein may be implemented within any filter design including, but not limited to, a ladder design or a lattice design. Additionally, a resonator 200 as disclosed herein may be implemented within any filter providing any type of filtering response such as, but not limited to, a low-pass filter, a high-pass filter, a band-pass filter, or a band-reject filter.

In some embodiments, a filter 902 includes at least one resonator 200 as disclosed herein formed as a stacked structure with two piezoelectric materials having antiparallel C-axis vectors 304 (e.g., as illustrated in FIGS. 7 and 8). As described previously herein, such a resonator 200 may beneficially provide desirable electromechanical coupling properties, thermal characteristics, and/or efficient mitigation of harmonic resonant modes (e.g., second-order resonant modes). Additionally, such a resonator 200 may provide relatively thicker electrodes than alternative resonator designs (e.g., single FBAR designs, or the like), which may beneficially provide relatively lower sheet resistance and may further enable operation at relatively higher frequencies such as, but not limited to 6 GHz and above. As a result, a filter 902 including one or more such resonators 200 may operate at a frequency equal to or greater than 6 GHz and may provide relatively low loss. For example, such a filter 902 may have a well-defined frequency response for signals with frequencies equal to or greater than 6 GHz. As an illustration, a filter 902 configured as a band-pass filter may have a passband including frequencies equal to or greater than 6 GHz. As another illustration, a filter 902 configured as a band-reject filter may have a stopband including frequencies equal to or greater than 6 GHz. Similarly, a filter 902 configured a low-pass and/or a high-pass may have a well-defined frequency response for frequencies equal to or greater than 6 GHz (e.g., either a passband or a stopband with a selected transmissivity).

In some embodiments, a filter 902 including at least one resonator 200 as disclosed herein is implemented within an RF communications system. For example, a filter 902 including at least one resonator 200 as disclosed herein is implemented in a transmission pathway of an RF communications system. In this way, the relatively low loss of the filter 902 provided by the resonators 200 as disclosed herein may facilitate relatively higher transmit distances. As another example, a filter 902 including at least one resonator 200 as disclosed herein is implemented in a reception pathway of an RF communications system. In this way, the relatively low loss of the filter 902 provided by the resonators 200 as disclosed herein may facilitate relatively low noise figures.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include, but are not limited to, physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A resonator comprising:
a first electrode;
a second electrode; and
a piezoelectric material between the first electrode and the second electrode, wherein the piezoelectric material is formed by:
fabricating the piezoelectric material with a compression axis vector (C-axis vector) oriented along a first direction, the piezoelectric material being doped with one or more dopant materials selected to lower an electric field strength for modifying the C-axis vector to a range of values lower than a breakdown threshold; and
applying an electric field across the piezoelectric material to modify a direction of the C-axis vector to be oriented along a second direction, wherein the second direction is antiparallel to the first direction.

2. The resonator of claim 1, further comprising:
an additional piezoelectric material having an additional C-axis vector oriented along the first direction, wherein the piezoelectric material and the additional piezoelectric material are disposed between the first and second electrodes.

3. The resonator of claim 2, further comprising:
a third electrode disposed between the piezoelectric material and the additional piezoelectric material.

4. The resonator of claim 1, wherein the piezoelectric material comprises:
a base material doped with the one or more dopant materials.

5. The resonator of claim 4, wherein the base material includes aluminum nitride, wherein the one or more dopant materials include at least one of a rare earth metal or boron.

6. The resonator of claim 4, wherein the base material includes aluminum nitride, wherein the one or more dopant materials include scandium with a concentration of less than approximately 35%.

7. The resonator of claim 1, wherein the resonator operates at a frequency equal to or greater than 6 GHz.

8. The resonator of claim 1, wherein applying the electric field across the piezoelectric material to modify the direction of the C-axis vector from the first direction to the second direction comprises:
fabricating one or more electrical pathways from the first electrode to an electrical contact;
applying the voltage between the electrical contact and at least one of the second electrode or an additional electrode to generate the electric field; and
severing at least one of the one or more electrical pathways.

9. A circuit comprising:
one or more resonators, wherein at least one of the one or more resonators comprises:
a first electrode;
a second electrode; and
a piezoelectric material between the first electrode and the second electrode, wherein the piezoelectric material is formed by:
fabricating the piezoelectric material with a compression axis vector (C-axis vector) oriented along a first direction; and
applying an electric field across the piezoelectric material to modify a direction of the C-axis vector to be oriented along a second direction, wherein the second direction is different than the first direction;
wherein the piezoelectric material is doped with one or more dopant materials selected to lower an electric field strength for modifying the C-axis vector to a range of values lower than a breakdown threshold.

10. The circuit of claim 9, wherein the circuit comprises:
a filter.

11. The circuit of claim 10, wherein the filter operates at a frequency equal to or greater than 6 GHz.

12. The circuit of claim 9, further comprising:
an additional piezoelectric material having an additional C-axis vector oriented along the first direction, wherein the piezoelectric material and the additional piezoelectric material are disposed between the first and second electrodes.

13. The circuit of claim 12, further comprising:
a third electrode disposed between the piezoelectric material and the additional piezoelectric material.

14. The circuit of claim 9, wherein the piezoelectric material comprises:
a base material doped with the one or more dopant materials.

15. The resonator of claim 14, wherein the base material includes aluminum nitride, wherein the one or more dopant materials include at least one of a rare earth metal or boron.

16. The resonator of claim 14 wherein the base material includes aluminum nitride, wherein the one or more dopant materials include scandium with a concentration of less than approximately 35%.

17. A method comprising:
fabricating a first electrode;
fabricating a piezoelectric material with a compression axis vector (C-axis vector) oriented along a first direction;
applying an electric field across the piezoelectric material to modify a direction of the C-axis vector from the first direction to a second direction, wherein the second direction is antiparallel to the first direction; and
fabricating a second electrode, wherein the piezoelectric material is disposed between the first electrode and the second electrode;
wherein the piezoelectric material being doped with one or more dopant materials selected to lower an electric field strength for modifying the C-axis vector to a range of values lower than a breakdown threshold.

18. The method of claim 17, further comprising:
fabricating an additional piezoelectric material having an additional C-axis vector oriented along the first direction.

19. The method of claim 18, further comprising:
fabricating a third electrode, wherein the additional piezoelectric material is disposed between the second electrode and the third electrode.

20. The method of claim 18, wherein the piezoelectric material and the additional piezoelectric material are disposed between the first electrode and the second electrode.

* * * * *